(12) United States Patent
Saito et al.

(10) Patent No.: US 7,915,130 B2
(45) Date of Patent: Mar. 29, 2011

(54) METHOD OF MANUFACTURING A SEMICONDUCTOR DEVICE

(75) Inventors: Tomohiro Saito, Yokohama (JP); Akio Kaneko, Kawasaki (JP); Atsushi Yagishita, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/588,336

(22) Filed: Oct. 13, 2009

(65) Prior Publication Data
US 2010/0035396 A1  Feb. 11, 2010

Related U.S. Application Data

(62) Division of application No. 11/635,039, filed on Dec. 7, 2006, now abandoned.

(30) Foreign Application Priority Data

Dec. 16, 2005  (JP) .................. 2005-363355

(51) Int. Cl.
*H01L 21/336* (2006.01)
(52) U.S. Cl. .... 438/300; 438/592; 257/329; 257/E21.41
(58) Field of Classification Search .................. 438/300, 438/592; 257/329, E21.41
See application file for complete search history.

(56) References Cited

U.S. PATENT DOCUMENTS

| | | | |
|---|---|---|---|
| 6,846,734 B2 | 1/2005 | Amos et al. | |
| 2004/0094807 A1 | 5/2004 | Chau et al. | |
| 2004/0142524 A1 | 7/2004 | Grupp et al. | |
| 2005/0104096 A1* | 5/2005 | Lee et al. | 257/288 |
| 2005/0136605 A1 | 6/2005 | Murto et al. | |
| 2005/0199963 A1* | 9/2005 | Aoyama | 257/369 |
| 2005/0258477 A1 | 11/2005 | Saito | |
| 2006/0071275 A1 | 4/2006 | Brask et al. | |

OTHER PUBLICATIONS

Kedzierski, J. et al., "Fabrication of Metal Gated FinFETs Through Complete Gate Silicidation With Ni," IEEE Transactions on Electron Devices, vol. 51, No. 12, pp. 2115-2120, (Dec. 2004).

* cited by examiner

*Primary Examiner* — Steven J Fulk
(74) *Attorney, Agent, or Firm* — Finnegan, Henderson, Farabow, Garrett & Dunner, L.L.P.

(57) ABSTRACT

This disclosure concerns a manufacturing method of a semiconductor device includes forming a Fin-type body on an insulation layer, the Fin-type body being made of a semiconductor material and having an upper surface covered with a protective film; forming a gate insulation film on side surfaces of the Fin-type body; depositing a gate electrode material so as to cover the Fin-type body; planarizing the gate electrode material; forming a gate electrode by processing the gate electrode material; depositing an interlayer insulation film so as to cover the gate electrode; exposing the upper surface of the gate electrode; depositing a metal layer on the upper surface of the gate electrode; siliciding the gate electrode by reacting the gate electrode with the metal layer; forming a trench on the upper surface of the protective film by removing an unreacted metal in the metal layer; and filling the trench with a conductor.

10 Claims, 33 Drawing Sheets

METHOD OF MANUFACTURING A SEMICONDUCTOR DEVICE

CROSS-REFERENCE TO RELATED APPLICATION

This is a divisional application of application Ser. No. 11/635,039, filed Dec. 7, 2006, now abandoned, and is also based upon and claims benefit of priority from the prior Japanese Patent Application No. 2005-363355, filed on Dec. 16, 2005, the entire contents of both of which are incorporated herein by reference.

BACKGROUND OF THE INVENTION

1. Field of the Invention

The present invention relates to a semiconductor device and a method of manufacturing the same.

2. Related Art

A FIN-FET (Fin-type Field-Effect Transistor) is developed to improve a current driving ability of a transistor. When a polysilicon electrode is used for the FIN-FET, since it is difficult to adjust a threshold voltage, a FIN-FET using a metal gate electrode is taken into consideration. Full silicidation is available as one of metal gate electrode forming methods. When a gate electrode material composed of polysilicon is deposited, a step is formed on a surface of a gate electrode material by a body portion of the Fin. When the step is formed on the surface of the gate electrode material, a depth of focus has no margin when a gate electrode is patterned, which makes it impossible to minutely pattern the gate electrode. Accordingly, the gate electrode is patterned after the upper portion of the gate electrode material is flattened by CMP.

However, when the upper portion of the gate electrode material is flattened, the thickness of the gate electrode material on the Fin is made thinner than that of the gate electrode material disposed at sides of the Fin. When the gate electrode material is subjected to silicidation in this constitution, a relatively large amount of metal is supplied to the gate electrode material on the Fin. Accordingly, silicide containing a large amount of metal is formed on the Fin, and silicide containing a small amount of metal is formed in the sides of the Fin. Thus, when unreacted metal is removed, the silicide on the Fin is etched. As a result, a metal gate electrode is disconnected (has an increased resistance) on the Fin, from which a problem arises in that the Fin transistor does not operate normally.

SUMMARY OF THE INVENTION

A manufacturing method of a semiconductor device according to an embodiment of the present invention comprises forming a Fin-type body on an insulation layer, the Fin-type body being made of a semiconductor material and having an upper surface covered with a protective film; forming a gate insulation film on side surfaces of the Fin-type body; depositing a gate electrode material so as to cover the Fin-type body; planarizing the gate electrode material; forming a gate electrode by processing the gate electrode material; depositing an interlayer insulation film so as to cover the gate electrode; exposing the upper surface of the gate electrode; depositing a metal layer on the upper surface of the gate electrode; siliciding the gate electrode by reacting the gate electrode with the metal layer; forming a trench on the upper surface of the protective film by removing an unreacted metal in the metal layer; and filling the trench with a conductor.

A manufacturing method of a semiconductor device according to an embodiment of the present invention comprises forming a Fin-type body on an insulation layer, the Fin-type body being made of a semiconductor material and having an upper surface covered with a protective film; forming a gate insulation film on side surfaces of the Fin-type body; depositing a gate electrode material so as to cover the Fin-type body; exposing the upper surface of the protective film by flattening the gate electrode material; depositing a cap material different from the gate electrode material on the gate electrode material and the protective film; forming a gate electrode and a cap covering the upper surface of the gate electrode by processing the gate electrode material and the cap material; depositing an interlayer insulation film so as to cover the gate electrode and the cap; exposing the upper surface of the cap by planarizing the interlayer insulation film; exposing the upper surfaces of the gate electrode and the protective film by removing the cap as well as forming a trench on the upper surfaces of the gate electrode and the protective film; depositing a metal layer on the upper surface of the gate electrode; siliciding the gate electrode by reacting the gate electrode with the metal layer; removing an unreacted metal in the metal layer; and filling the trenches with a conductor.

A manufacturing method of a semiconductor device according to an embodiment of the present invention comprises forming a Fin-type body on an insulation layer, the Fin-type body being made of a semiconductor material and having an upper surface covered with a protective film; forming a gate insulation film on side surfaces of the Fin-type body; depositing a gate electrode material on the gate insulation film; depositing a covering material different from the gate electrode material so as to cover the Fin-type body and the gate electrode material; planarizing the covering material; forming a gate electrode and a cover covering the upper surface of the gate electrode by processing the gate electrode material and the covering material; forming a gate side wall on side surfaces of the gate electrode and the cover; depositing an interlayer insulation film so as to cover the gate electrode and the cover; exposing the upper surface of the cover by planarizing the interlayer insulation film; forming a trench on the upper surface and side surfaces of the gate electrode by removing the cover; depositing a metal layer on the upper surface and the side surfaces of the gate electrode; siliciding the gate electrode by reacting the gate electrode with the metal layer; removing an unreacted metal in the metal layer; and filling the trenches with a conductor.

A manufacturing method of a semiconductor device according to an embodiment of the present invention comprises forming a Fin-type body on an insulation layer, the Fin-type body being made of a semiconductor material and having an upper surface covered with a protective film; forming a gate insulation film on side surfaces of the Fin-type body; depositing a gate electrode material so as to cover the Fin-type body; depositing a first insulation film so as to cover the gate electrode material; depositing a second insulation film so as to cover the first insulation film; planarizing the second insulation film; patterning the second insulation film into a gate electrode pattern; patterning the first insulation film into the gate electrode pattern by using the second insulation film as a mask; patterning the gate electrode material into the gate electrode pattern by using the first insulation film as a mask; depositing a metal layer on the gate electrode; siliciding the gate electrode by reacting the gate electrode with the metal layer.

A manufacturing method of a semiconductor device according to an embodiment of the present invention comprises forming a Fin-type body on an insulation layer, the Fin-type body being made of a semiconductor material and having an upper surface covered with a protective film; forming a gate insulation film on side surfaces of the Fin-type body; depositing a gate electrode material so as to cover the Fin-type body; depositing a mask insulation layer so as to cover the gate electrode material; planarizing the mask insulation layer; patterning the mask insulation layer into a gate electrode pattern; forming a gate electrode by patterning the gate electrode material into the gate electrode pattern using the mask insulation layer as a mask.

A method of manufacturing a semiconductor device according to an embodiment of the present invention comprises sequentially depositing a first insulation film, a conductor, and a second insulation film on a semiconductor layer; patterning the second insulation film; forming a Fin-type body by etching the conductor, the first insulation film, and the semiconductor layer using the second insulation film as a mask after patterning the second insulation film; forming a gate insulation film on side surfaces of the Fin-type body; depositing a gate electrode material so as to cover the Fin-type body; etching the gate electrode material to a level lower than the bottom surface of the conductor; removing the gate insulation film formed on the side surfaces of the conductor; further depositing the gate electrode material so as to cover the conductor and the second insulation film; flattening the gate electrode material; patterning the gate electrode material into a gate electrode pattern; and forming the gate electrode by patterning the gate electrode material into the gate electrode pattern using the mask insulation film as a mask.

A semiconductor device according to an embodiment of the present invention comprises an insulation layer; a Fin-type body formed on the insulation layer and made of a semiconductor material; a gate insulation film formed on side surfaces of the Fin-type body; a gate electrode having portions formed on both the side surfaces of the Fin-type body; and a conductor formed on the Fin-type body for connecting the portion of the gate electrode on one side surface of the Fin-type body to the portion thereof on the other side of the Fin-type body.

BRIEF DESCRIPTION OF THE DRAWINGS

FIG. 24 to FIG. 30B are cross-sectional views showing a manufacturing method of a semiconductor device according to a fourth embodiment;

FIGS. 31A to 32B are cross-sectional views showing a manufacturing method of a semiconductor device according to the fifth embodiment; and FIGS. 33 to 41B are cross-sectional views showing a manufacturing method of a semiconductor device according to a sixth embodiment.

DETAILED DESCRIPTION OF THE INVENTION

Embodiments according to the present invention will be described below with reference to the drawings. These embodiments by no means restrict the present invention.

First Embodiment

FIGS. 1 to 7 are a perspective view showing a method of manufacturing a semiconductor device according to a first embodiment of the present invention. First, an SOI (Silicon On Insulator) substrate is prepared. An SOI layer 30 has a thickness of, for example, about 50 nm to 100 nm. Channel doping is carried out to a body region, which acts as a channel, of the SOI layer 30 so that the channel has an impurity density of about $1 \times 10^{17}$ cm$^{-3}$.

Figure 1:
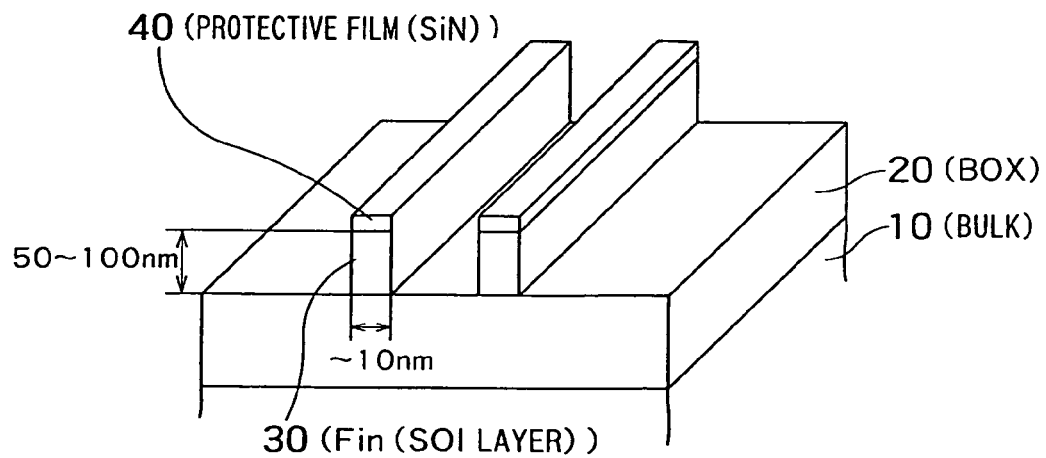
FIGS. 1 to 7 are a perspective view showing a manufacturing method of a semiconductor device according to a first embodiment of the present invention.

Next, a silicon nitride film 40 is deposited on the SOI layer 30 to a thickness of about 70 nm and patterned. The SOI layer 30 is etched by RIE using the silicon nitride film 40 as a hard mask after the silicon nitride film 40 is patterned. With this treatment, the Fin 30 composed of silicon is formed on a BOX layer 20 as shown in FIG. 1. The upper surface of the Fin 30 is covered with the silicon nitride film 40. Note that the material of the film 40 is not limited to silicon nitride. The silicon nitride film 40 may be removed before a gate electrode is formed. In this case, the upper surface of the Fin 30 also acts as a channel of a transistor.

Figure 2:
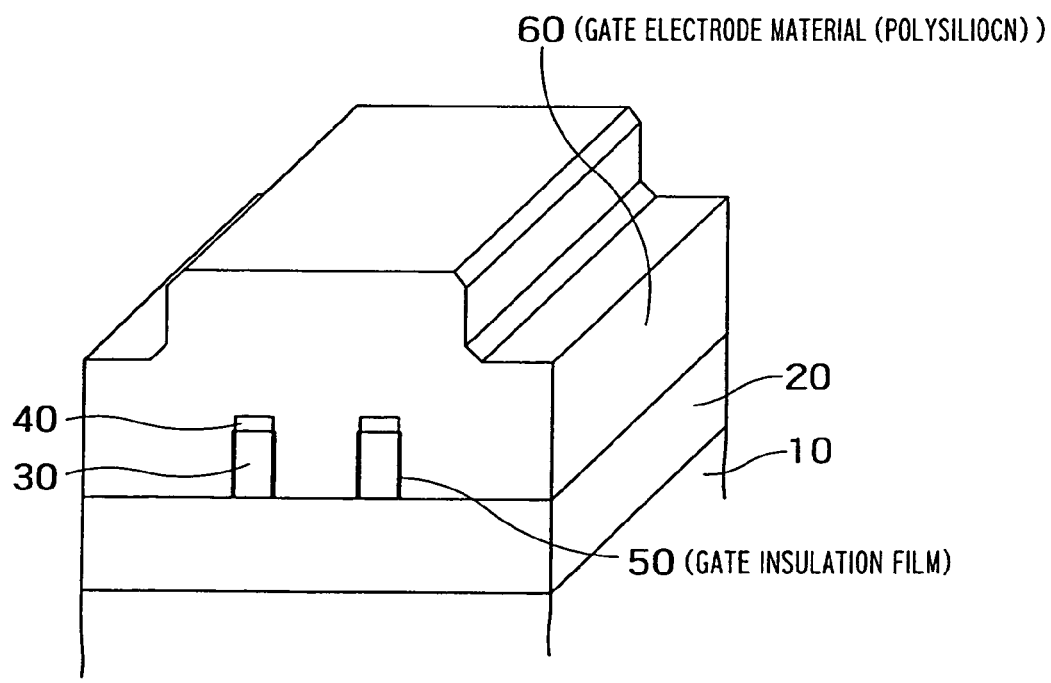
Figure 3:
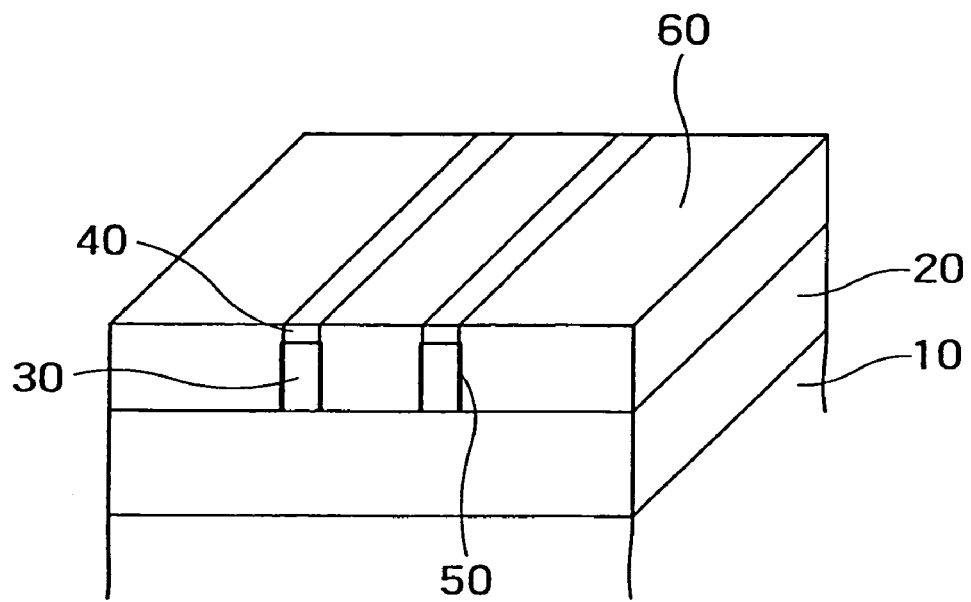
Figure 4:
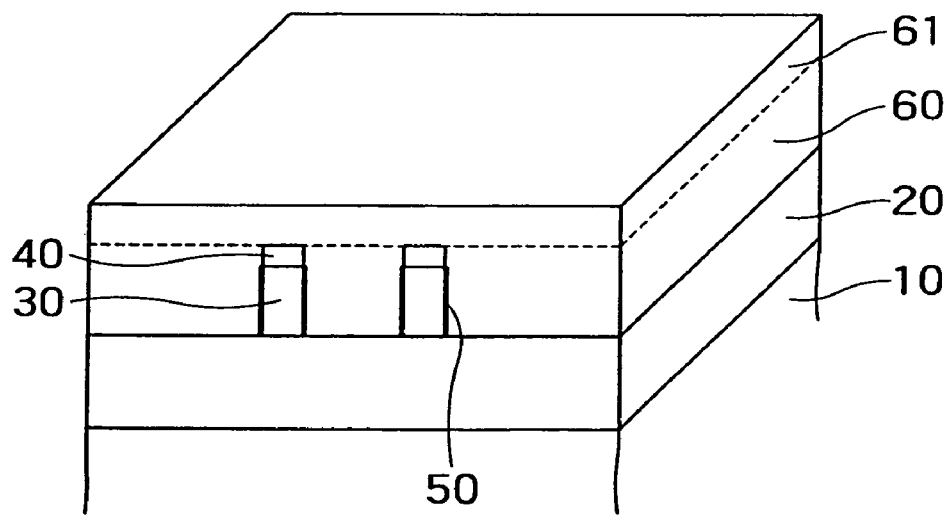

Next, a gate insulation film 50 is formed on side surfaces of the Fin 30. The gate insulation film 50 may be formed by oxidizing the Fin 30 or by depositing a high dielectric film such as hafnium silicate and the like on the Fin 30. Subsequently, a polysilicon film 60 is deposited to a thickness of about 300 nm as a gate electrode material. At the time, since the polysilicon film 60 is deposited so as to cover the Fin 30, a large step is formed on the surface of the polysilicon film 60 according to the step of the Fin 30 as shown in FIG. 2. It is difficult to form a gate electrode pattern on the stepped surface of the polysilicon film 60 by a photoresist. To cope with this problem, the polysilicon film 60 is flattened by CMP (Chemical Mechanical Polishing) and etched back until the silicon nitride film 40 is exposed as shown in FIG. 3. Next, as shown in FIG. 4, a polysilicon film 61 is deposited again as a gate electrode material. At the time, the polysilicon film 61 has a thickness of, for example, about 50 nm.

Figure 5:
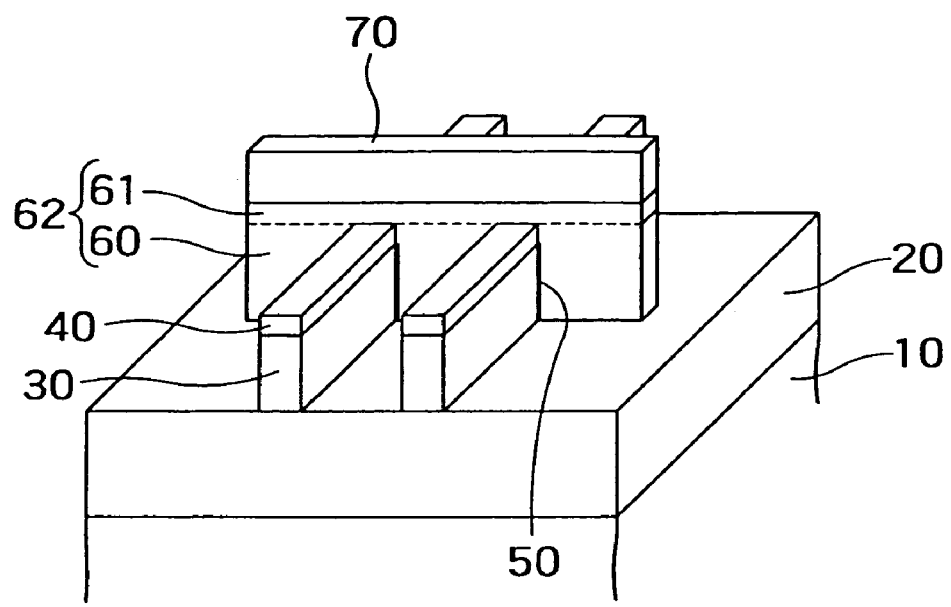

Next, a silicon nitride film 70 used as a hard mask is deposited on the polysilicon film 61 to a thickness of about 100 nm. As shown in FIG. 5, the silicon nitride film 70 is formed into a gate electrode pattern using lithography and RIE. Next, the polysilicon films 60, 61 are etched by RIE using the silicon nitride film 70 as the hard mask after it is patterned. With this treatment, a gate electrode 62 composed of polysilicon is formed so as to cover both the side surfaces and the upper surface of the body region (channel region) of the Fin 30 as shown in FIG. 5. The polysilicon films 60, 61 are collectively called a gate electrode 62. A silicon nitride film 70 is used as a protective film of the gate electrode 62 at a subsequent step. Accordingly, the silicon nitride film 70 is also called a protective film 70.

Figure 6:
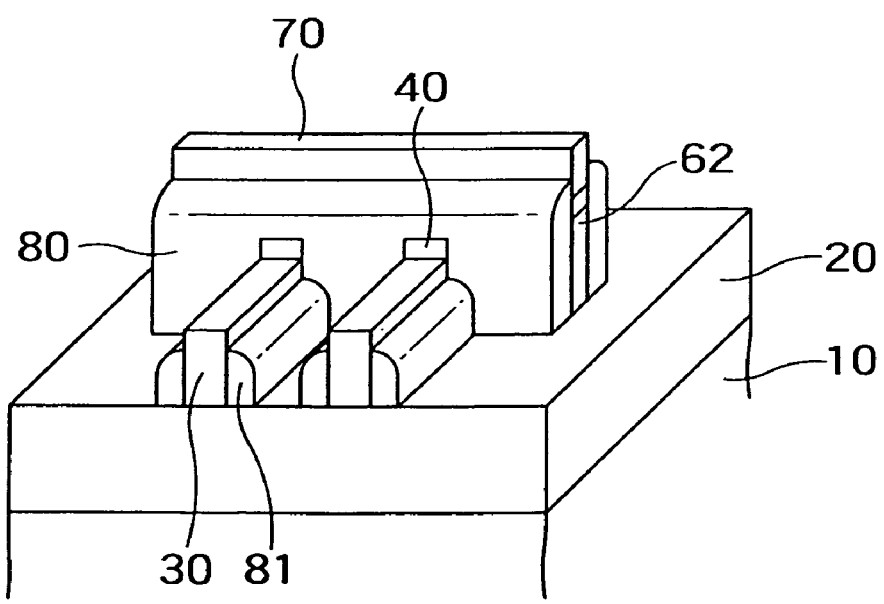

Thereafter, a TEOS film is deposited as a material of a gate side wall film. As shown in FIG. 6, a gate side wall film 80 is formed by etching back the TEOS film. The gate side wall film 80 has thickness of about 40 nm. At the time, a side wall film 81 may be formed also on side surfaces of the Fin 30. Next, the silicon nitride film 40 on the Fin 30 is removed by being RIE etched. At the time, although the protective film 70 on the gate electrode 62 is also etched, it remains on the gate electrode 62 because it is thicker than the silicon nitride film 40. Further, the silicon nitride film 40 on the body region in the Fin 30 remains because it is covered with the gate electrode 62.

Next, the source/drain region in the Fin 30 is subjected to silicidation. For example, Er may be used for nMOS and Pt may be used for pMOS as a metal material used to subject the source/drain region to silicidation. With this arrangement, the source/drain region of the nMOS is made to ErSi and the source/drain region of the pMOS is made to PtSi. At the time, the gate electrode 62 is not subjected to silicidation because it is covered with the silicon nitride film 70 and the gate side wall film 80.

Figure 7:
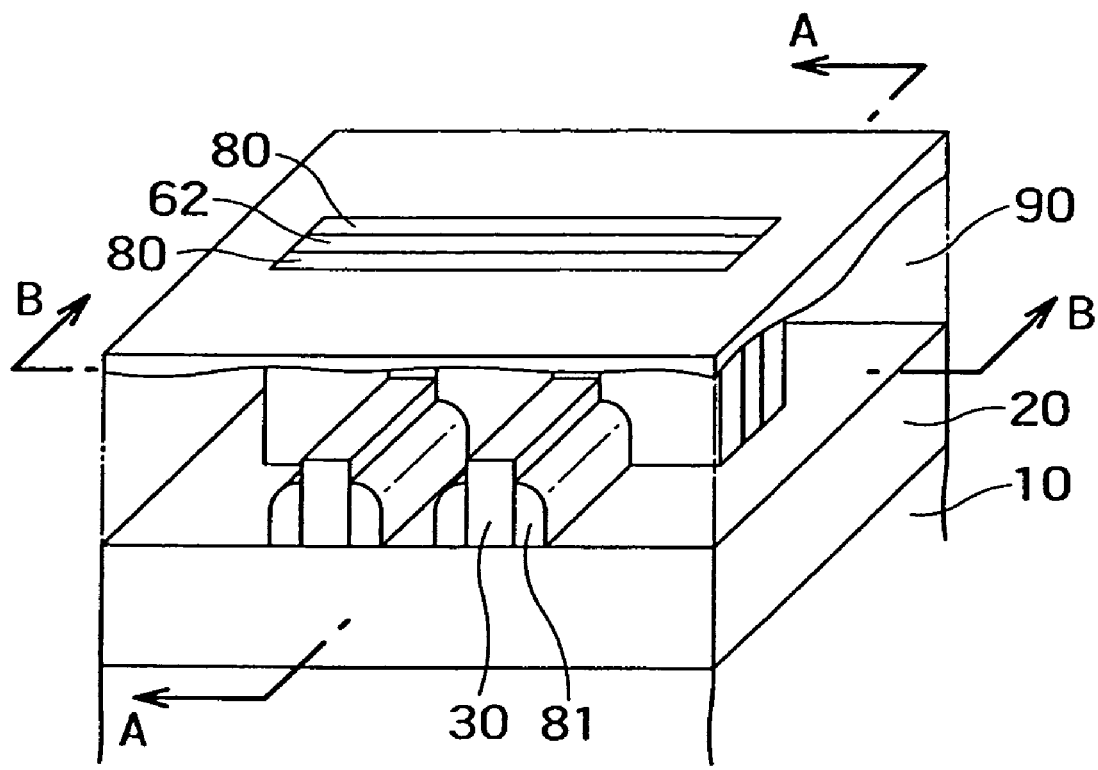
Figure 8:
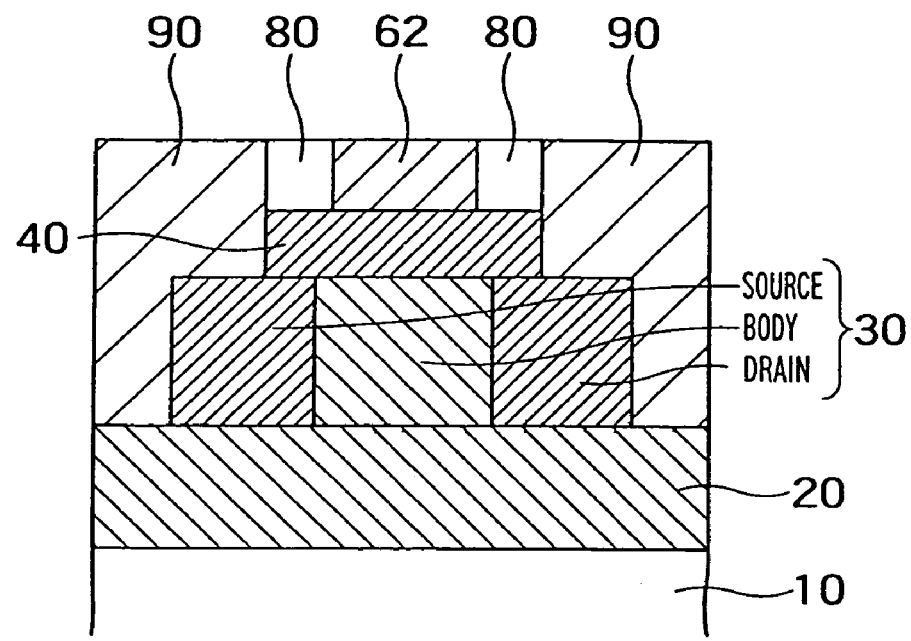
FIG. 8A is a cross-sectional view taken along a line A-A of FIG. 7.
FIG. 8B is a cross-sectional view taken along a line B-B of FIG. 7.
Figure 8:
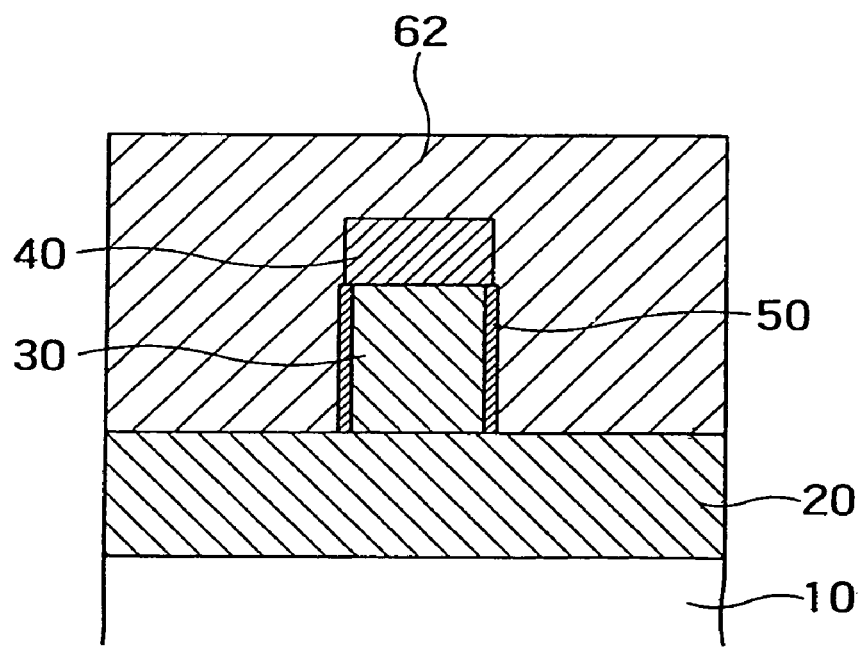
Figure 9:
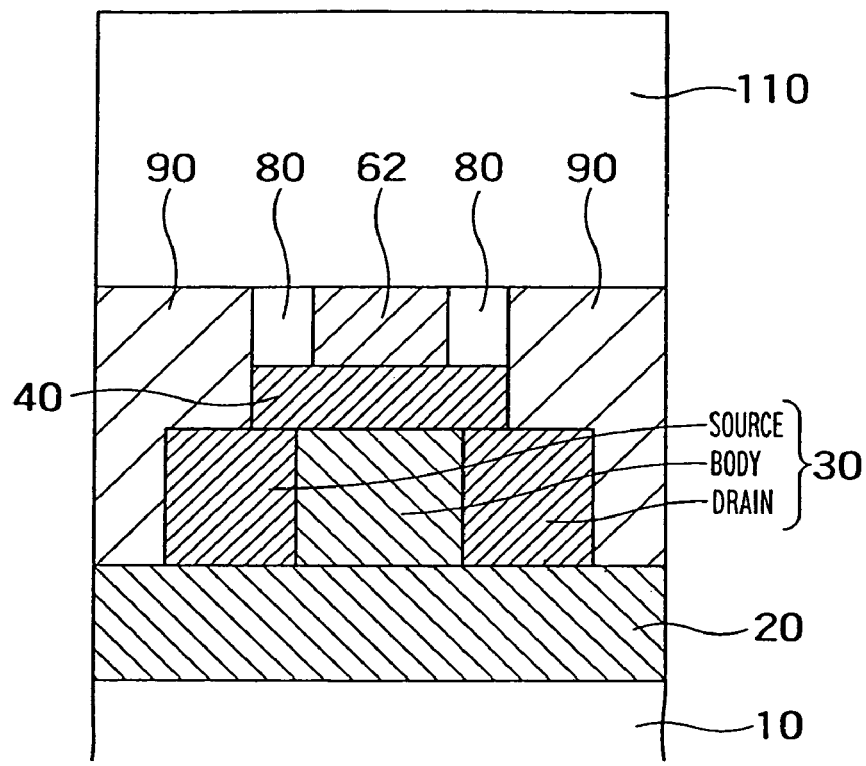
FIG. 9A is a cross-sectional view showing the manufacturing method following FIG. 8A.
FIG. 9B is a cross-sectional view showing the manufacturing method following FIG. 8B.
Figure 9:
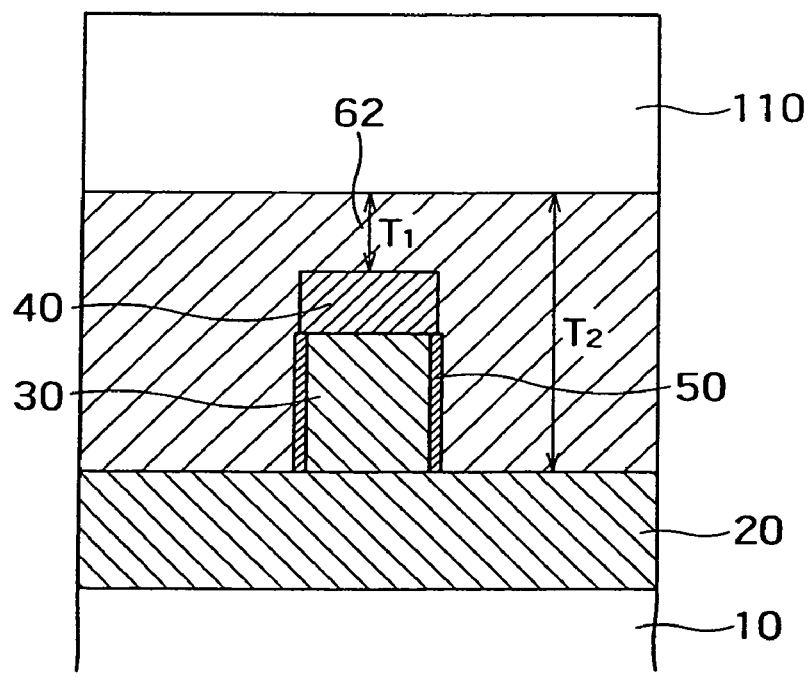
Figure 10:
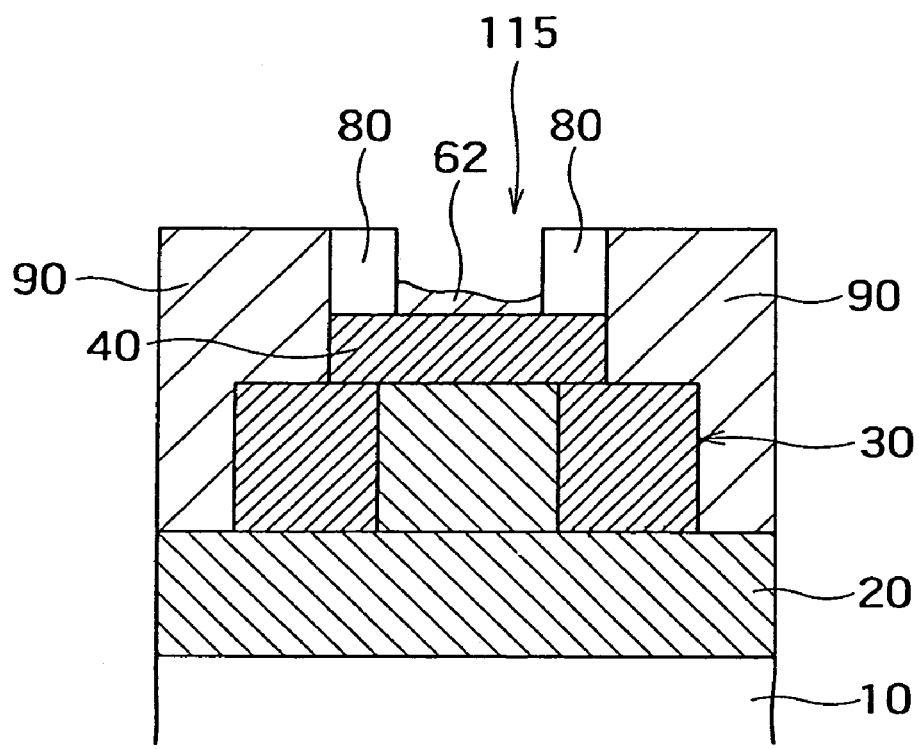
FIG. 10A is a cross-sectional view showing the manufacturing method following FIG. 9A.
FIG. 10B is a cross-sectional view showing the manufacturing method following FIG. 9B.
Figure 10:
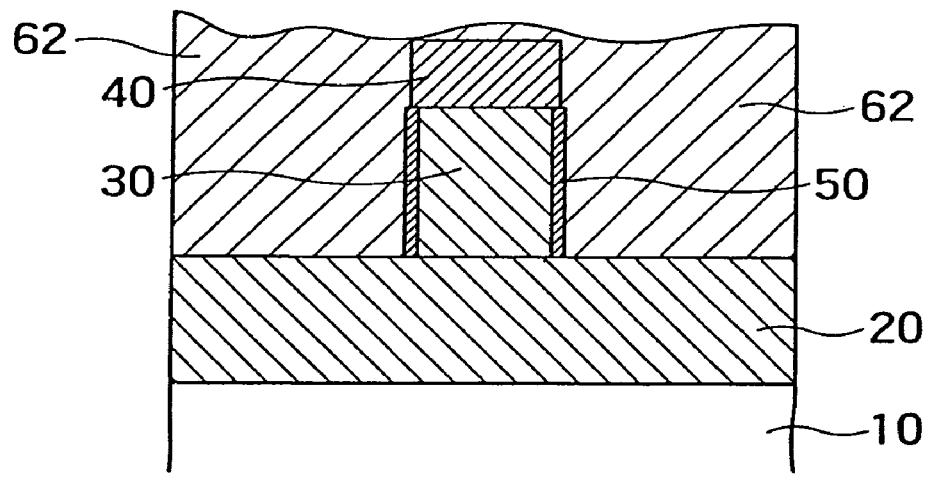
Figure 11:
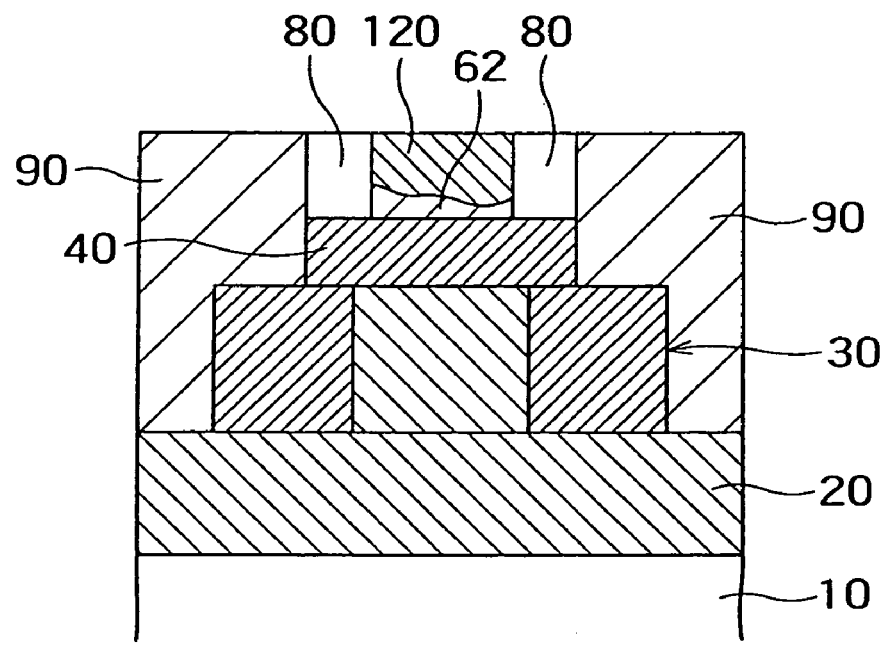
FIG. 11A is a cross-sectional view showing the manufacturing method following FIG. 10A.
FIG. 11B is a cross-sectional view showing the manufacturing method following FIG. 10B.
Figure 11:
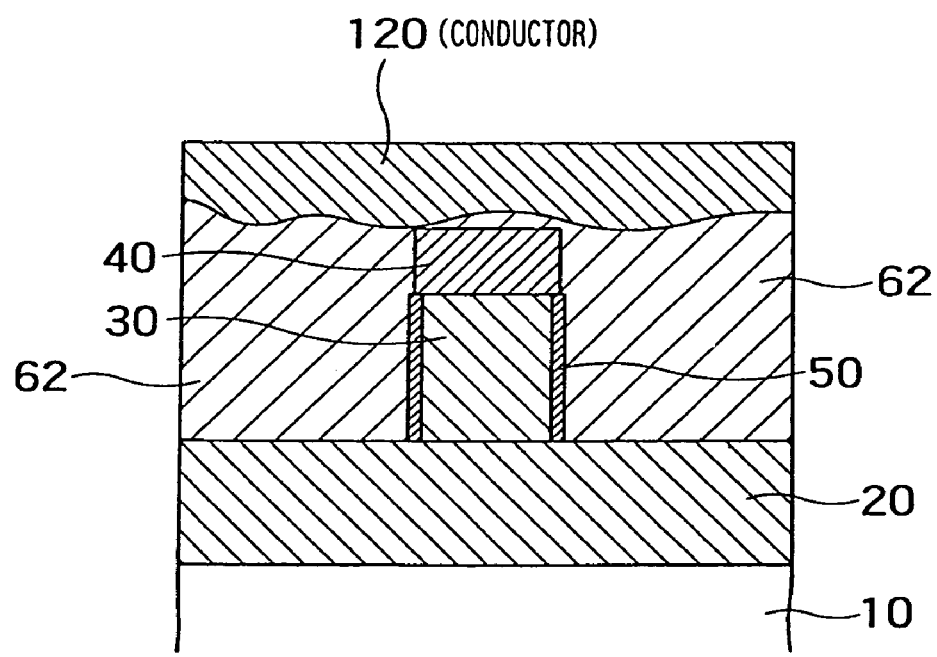
Figure 12:
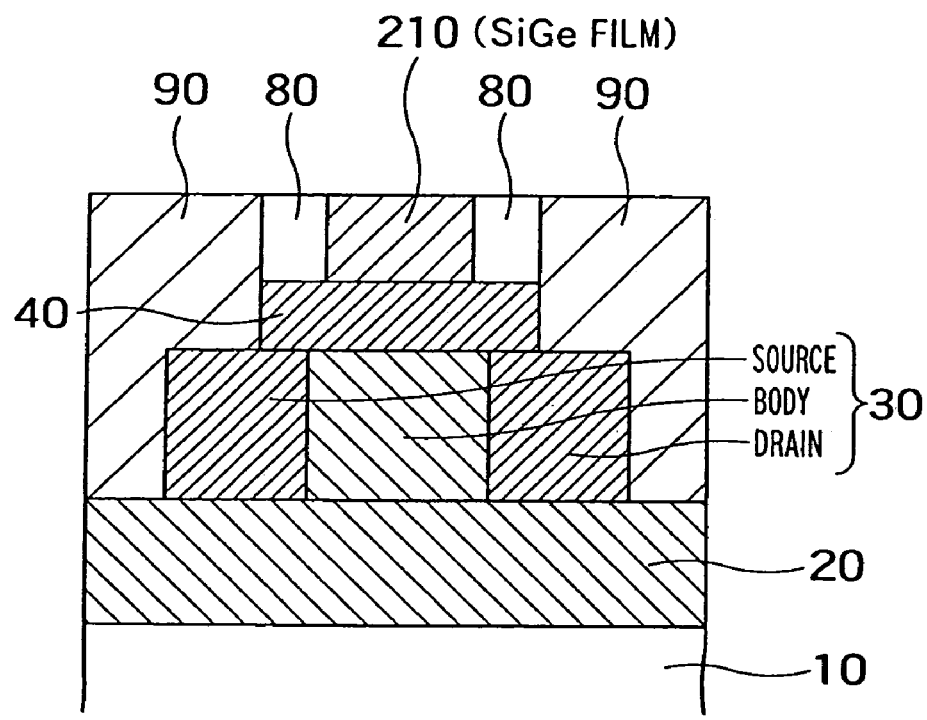
FIG. 12A is a cross-sectional view corresponding to a cross section taken along the line A-A of FIG. 7 showing a manufacturing method according to a second embodiment.
FIG. 12B is a cross-sectional view corresponding to a cross section taken along the line B-B of FIG. 7 showing a manufacturing method according to the second embodiment.
Figure 12:
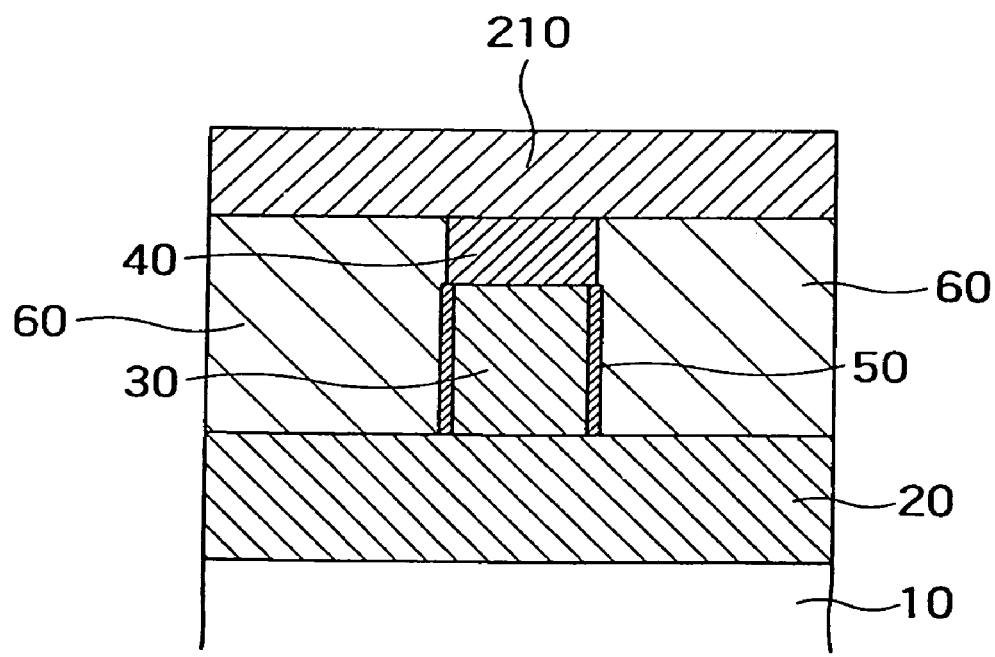

Next, an interlayer insulation film 90 composed of, for example, a TEOS film is deposited to a thickness of about 400 nm. Subsequently, the interlayer insulation film 90 is flattened by CPM, thereby the surface of the gate electrode 62 is exposed. Alternately, CMP may be stopped before the gate electrode 62 is polished up to the surface thereof. In this case, the protective film 70 is removed using a thermal phosphoric acid solution. With this treatment, the upper surface of the gate electrode 62 is exposed. FIG. 7 shows a structure at the time.

Subsequent manufacturing steps will be described referring to FIG. 8A to FIG. 11B.

FIGS. 8A, 9A, 10A, and 11A are cross-sectional views taken along a line A-A of FIG. 7. FIGS. 8B, 9B, 10B and FIG. 11B are cross-sectional views taken along a line B-B of FIG. 7. When the upper surface of the gate electrode 62 is exposed by CMP or the like, a structure shown in FIGS. 8A and 8B are obtained.

Next, as shown in FIGS. 9A and 9B, a metal layer 110 composed of, for example, nickel is deposited on the gate electrode 62. Next, the gate electrode 62 composed of polysilicon and the metal layer 110 composed of nickel are silicided by subjecting the structure shown in FIGS. 9A and 9B to a heat treatment. With these treatments, the gate electrode 62 is made to nickel silicide (NiSi). In this process, the gate electrode 62 is fully silicided. This means that the overall gate electrode 62 is substantially silicided, and it is not always necessary to fully silicided the overall gate electrode 62. For example, polysilicon may somewhat remain in the portion of the gate electrode 62 in contact with the BOX layer 20.

Here, it is desired to pay attention to the gate electrode 62 of FIG. 9B. The film thickness T1 of the portion of the gate electrode 62 on the silicon nitride film 40 is relatively thin, whereas the thickness T2 of the portion of the gate electrode 62 in the vicinities of the side surfaces of the Fin 30 is relatively thick. Accordingly, the gate electrode 62 on the silicon nitride film 40 is made to silicide having a large nickel content (hereinafter, referred to as Ni rich silicide) as well as the gate electrode 62 in the vicinities of the side surfaces of the Fin 30 is made to silicide having a small nickel content (hereinafter, referred to as Si rich silicide).

Subsequently, the unreacted metal in the metal layer 110 is removed. At the time, since the Ni rich silicide has the large nickel content, it is removed likewise the metal. Accordingly, as shown in FIGS. 10A and 10B, the upper portion of the gate electrode 62, which is made to the Ni rich silicide, is also removed off, and a trench 115 is formed on the upper surface of the gate electrode 62. The trench 115 has a depth of about 50 nm. As can be found referring to FIG. 10B, when the upper portion of the gate electrode 62 is removed, the gate electrode 62 across the Fin 30 is disconnected in the portion of the trench 115 on the Fin 30. The problem described above is caused by this phenomenon.

To cope with the problem, the trench 115 is filled with a conductor 120 using a damascene process as shown in FIGS. 11A and 11B. In particularly, the conductor 120 is flattened by CMP after it is deposited. The thickness of the conductor 120 is, for example, about 150 nm. With this step, the conductor 120 is caused to remain in the trench 115. The conductor 120 is a metal containing any of, for example, nickel, tungsten, platinum, cobalt, molybdenum, aluminum, tantalum, titanium, erbium, ytterbium and palladium or a semiconductor containing germanium, silicon. Typically, the conductor 120 is nickel or polysilicon.

Thereafter, a Fin-FET is completed using a conventional semiconductor manufacturing method. For example, an interlayer insulation film composed of a silicon oxide film is deposited and a contact hole is formed thereto. Further, a metal wiring is formed.

In the embodiment, when the Ni rich silicide is removed, the trench 115 is formed on the gate electrode 62. Filling the trench 115 with the conductor 120 prevents the disconnection (increase in resistance) of the gate electrode 62 composed of silicide. With this arrangement, since an advantage of using the metal gate electrode for the Fin-FET can be sufficiently exhibited, the performance of the transistor can be improved.

Further, according to the embodiment, the full-silicidation of the gate electrode and the silicidation of the source/drain region can be carried out by separate steps. Accordingly, the source/drain region can be silicided up to a desired depth. In this way, a leak current and the like caused by excessively deep silicidation of the source/drain region can be suppressed.

In the first embodiment, nickel is used as the metal layer 110. However, the metal layer 110 may be composed of a metal such as tungsten, platinum, cobalt, molybdenum, titanium, erbium, ytterbium and palladium, or the like.

According to the embodiment, there can be manufactured the semiconductor device includes the BOX layer 20 as an insulation layer, the Fin 30 formed on the BOX layer 20 and made of a semiconductor material, the gate insulation film 50 provided on the side surfaces of the Fin 30, the gate electrode 62 provided on both the side surfaces of the Fin 30, and the conductor 120 connecting the portion of the gate electrode 62 on one side surface of the Fin 30 and the portion of the gate electrode 62 on the other side surface thereof.

In the semiconductor device manufactured as described above, the portions of the gate electrode 62 provided on both the side surfaces of the Fin 30 are electrically connected to each other through the low resistance conductor. Accordingly, the semiconductor device can be operated normally without increasing the resistance of the gate electrode.

Second Embodiment

A method of manufacturing a semiconductor device of a second embodiment is different from the first embodiment in that a silicon germanium (SiGe) film 210 is deposited in place of the polysilicon film 61. In the manufacturing steps shown in FIGS. 1 to 7, since the manufacturing steps of the second embodiment other than a step of depositing the silicon germanium (SiGe) film 210 are the same as those of the first embodiment, explanation of them is omitted.

The SiGe film 210 is deposited as a cap material. The SiGe film 210 has a thickness of about 50 nm. The SiGe film 210 has a germanium concentration of about 30%.

FIGS. 12A, 13A, 14A, and 15A are cross-sectional views corresponding to a cross section taken along the line A-A of and 7. FIGS. 12B, 13B, 14B, and 15B are cross-sectional views corresponding to a cross section taken along the line B-B of FIG. 7. As shown in FIG. 12B, in the second embodiment, the SiGe film 210 is formed on a polysilicon film 60. The SiGe film 210 is formed as the cap and removed in a subsequent step. Accordingly, the polysilicon film 60 is used as a gate electrode. Hereinafter, the polysilicon film 60 is also called a gate electrode 60.

Figure 13:
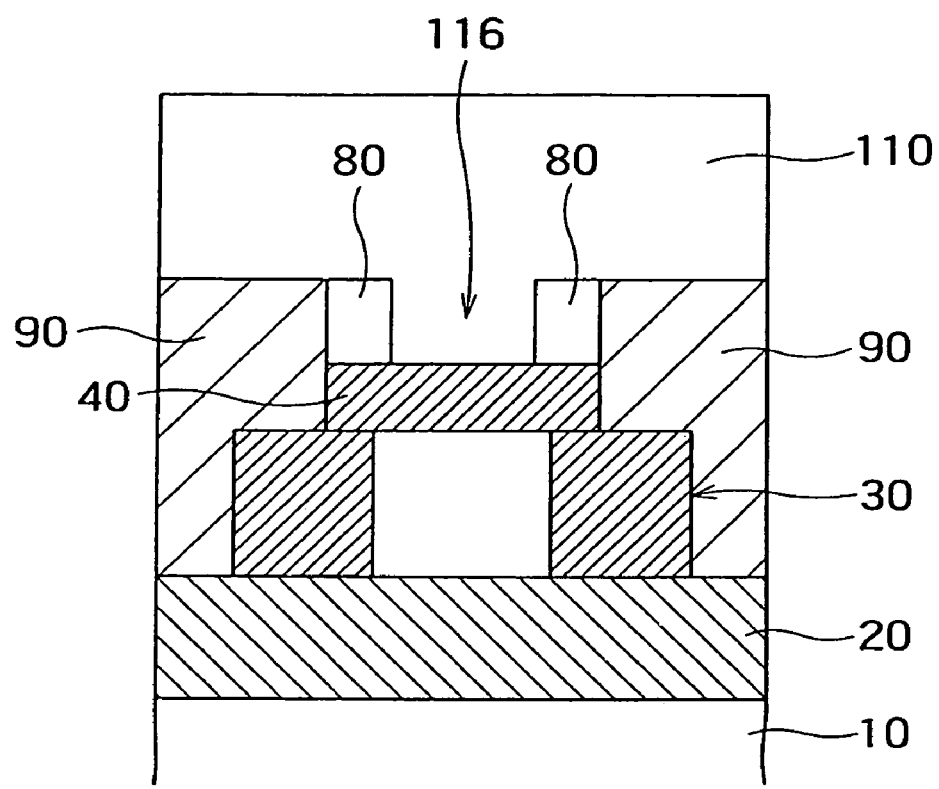
FIG. 13A is a cross-sectional view showing the manufacturing method following FIG. 12A.
FIG. 13B is a cross-sectional view showing the manufacturing method following FIG. 12B.
Figure 13:
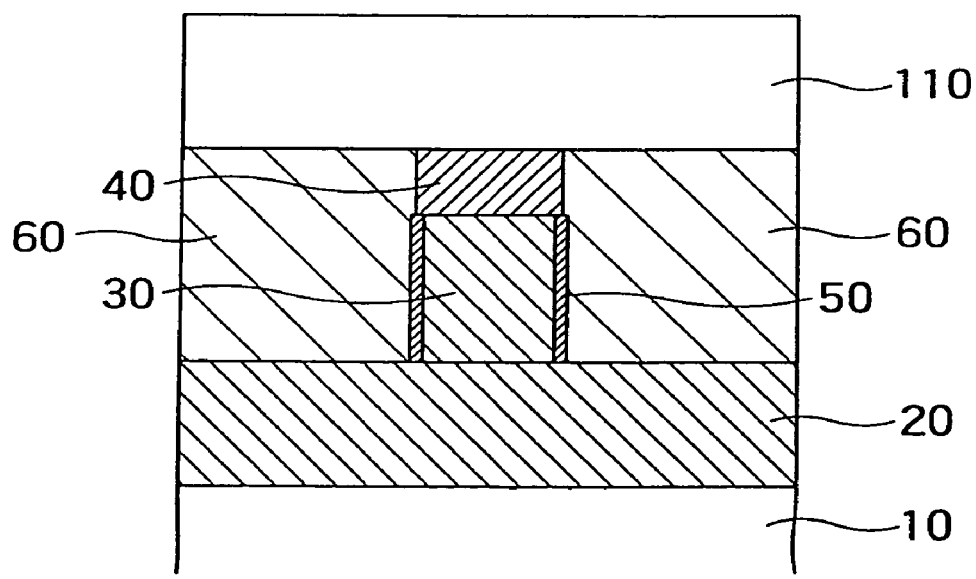

Next, the SiGe film 210 is selectively removed by wet etching. With this treatment, a trench 116 is formed on the upper surfaces of the polysilicon film 60 and a protective film 40. Further, the upper surface of the gate electrode 60 is exposed. Subsequently, as shown in FIGS. 13A and 13B, a metal layer 110 made of, for example, nickel is deposited on the gate electrode 60. Next, the gate electrode 60 made of polysilicon is silicided by heat-treating a structure shown in FIGS. 13A and 13B. With this treatment, the gate electrode 60 is made to nickel silicide (NiSi). At the time, the gate electrode 60 is fully silicided.

Here, it is desired to pay attention to the gate electrode 60 of FIG. 13B. Since the SiGe film 210 acting as the cap covers the silicon nitride film 40, no gate electrode 60 is provided on the silicon nitride film 40. Accordingly, no silicide is formed on the silicon nitride film 40. The metal layer 110 fully silicided the gate electrode 60 separated to both the sides of the Fin 30.

Figure 14:
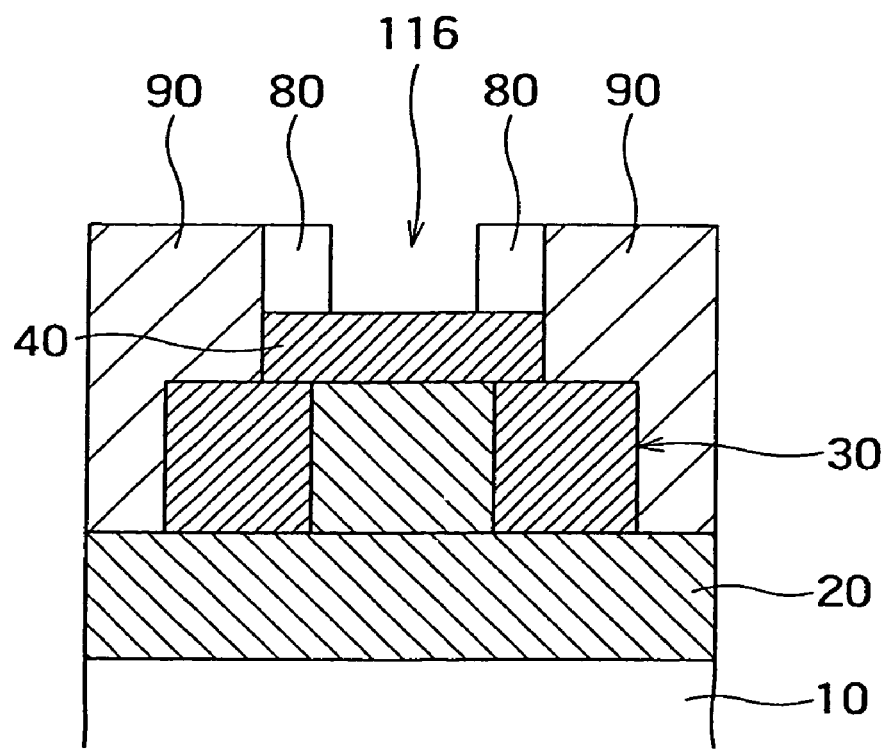
FIG. 14A is a cross-sectional view showing the manufacturing method following FIG. 13A.
FIG. 14B is a cross-sectional view showing the manufacturing method following FIG. 13B.
Figure 14:
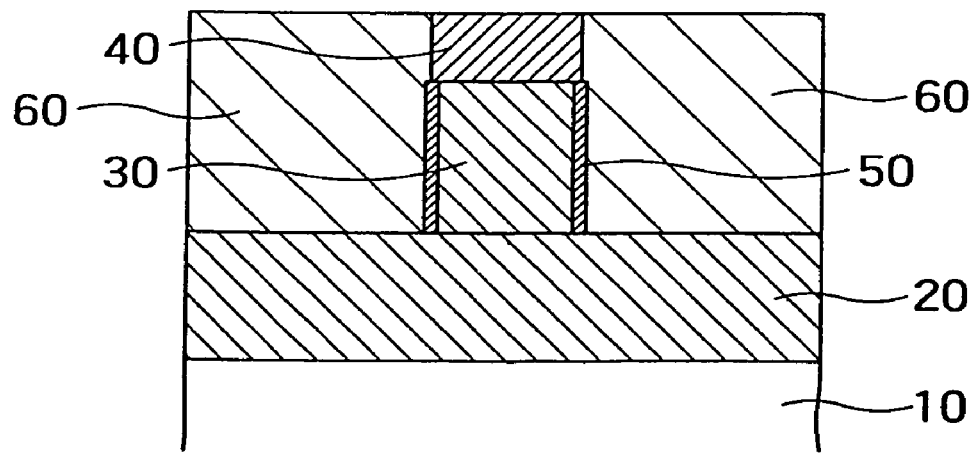

Subsequently, the unreacted metal in the metal layer 110 is removed. At the same time, a Ni rich silicide formed on the separated gate electrode 60 is removed. However, no silicide exists on the silicon nitride film 40, the upper surface of the silicon nitride film 40 is flat as shown in FIGS. 14A and 14B.

Figure 15:
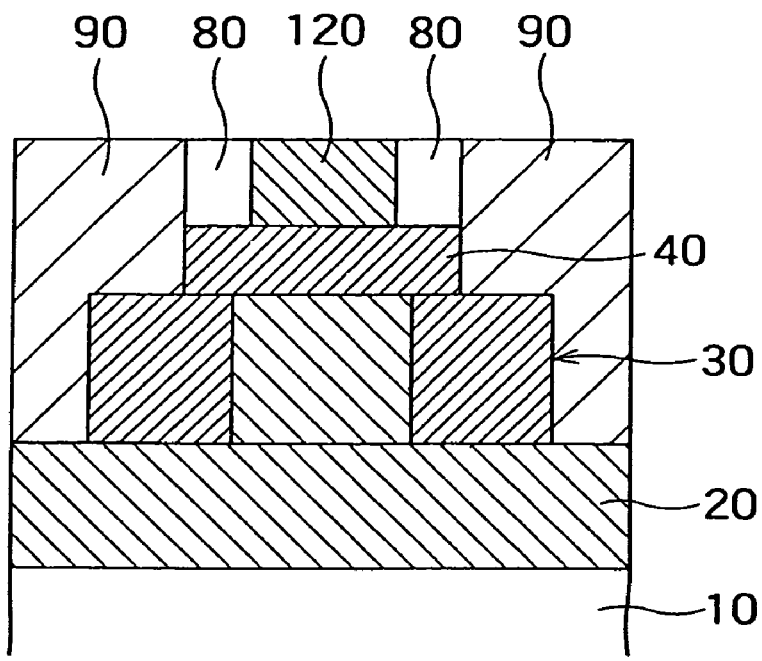
FIG. 15A is a cross-sectional view showing the manufacturing method following FIG. 14A.
FIG. 15B is a cross-sectional view showing the manufacturing method following FIG. 14B.
Figure 15:
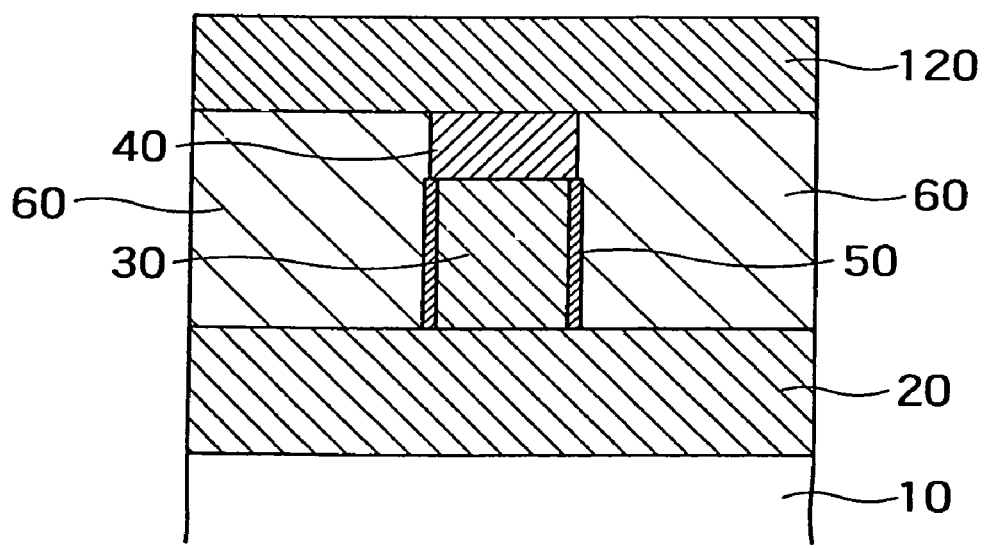

Next, as shown in FIGS. 15A and 15B, the trench 116 is filled with a conductor 120 using a damascene process. In particularly, the conductor 120 is flattened by CMP after it is deposited. The thickness of the conductor 120 is, for example, about 150 nm. With this arrangement, the conductor 120 is caused to remain in the trench 116.

According to the second embodiment, since the SiGe film 210 having the predetermined thickness is removed, the trench 116 having a predetermined depth is formed on the gate electrode 60 and the protective film 40. Since the conductor 120 is filled in the trench 116 by the damascene process, the conductor 120 is formed on the protective film 40 as thick as the SiGe film 210. More specifically, the thickness of the conductor 120 which is formed on the protective film 40 by the damascene process, can be controlled by controlling the thickness of the SiGe film 210. Accordingly, the damascene process can be applied easily as well as the thickness of the conductor 120 formed on the protective film 40 can be easily controlled. As a result, the resistance value of the gate electrode can be easily controlled. Further, the second embodiment has the same advantage as the first embodiment.

Third Embodiment

In the above embodiments, the metal layer 110 is deposited on the upper surface of the gate electrode 62, and gate electrode 62 is silicided only from the upper surface thereof. In this case, the proximity of the upper surface of the gate electrode 62 is made to Ni rich silicide, and the proximity of the bottom surface of the gate electrode 62 is made to Si rich silicide. Accordingly, the work function of the gate electrode 62 is different between the upper portion and the lower portion of the Fin 30. Thus, the threshold voltage of a transistor is different between the upper and lower portions of the Fin 30. As a result, the threshold voltage of the transistor may be dispersed and the S-factor (sub-threshold characteristics) thereof may be deteriorated.

A method of manufacturing a semiconductor device of a third embodiment can manufacture a semiconductor device that suppresses dispersion of the threshold voltage and the S-factor.

Figure 16:
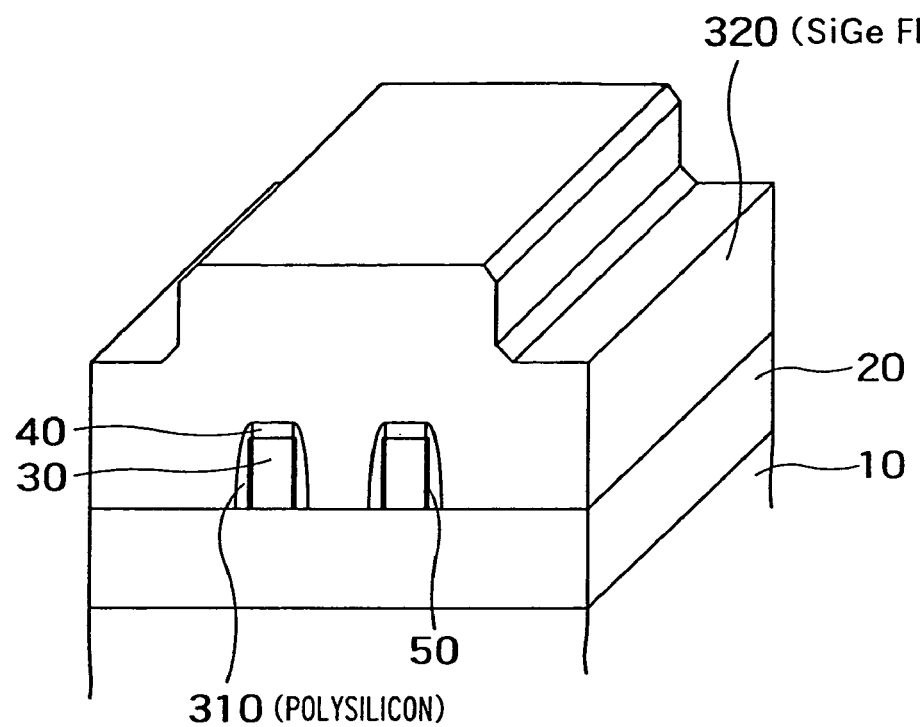
FIGS. 16 to 19 are perspective views showing the manufacturing method of the semiconductor device according to a third embodiment.
Figure 17:
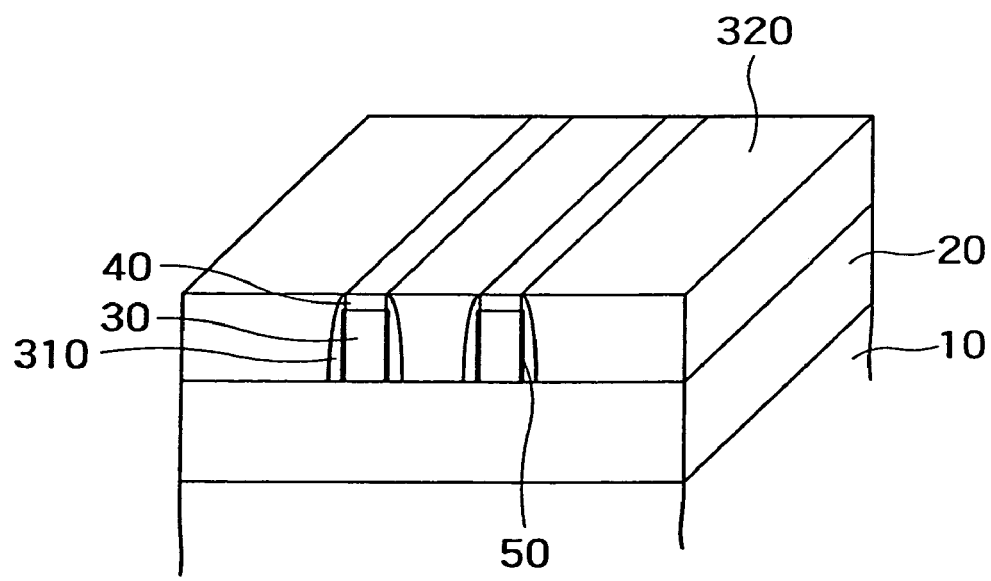
Figure 18:
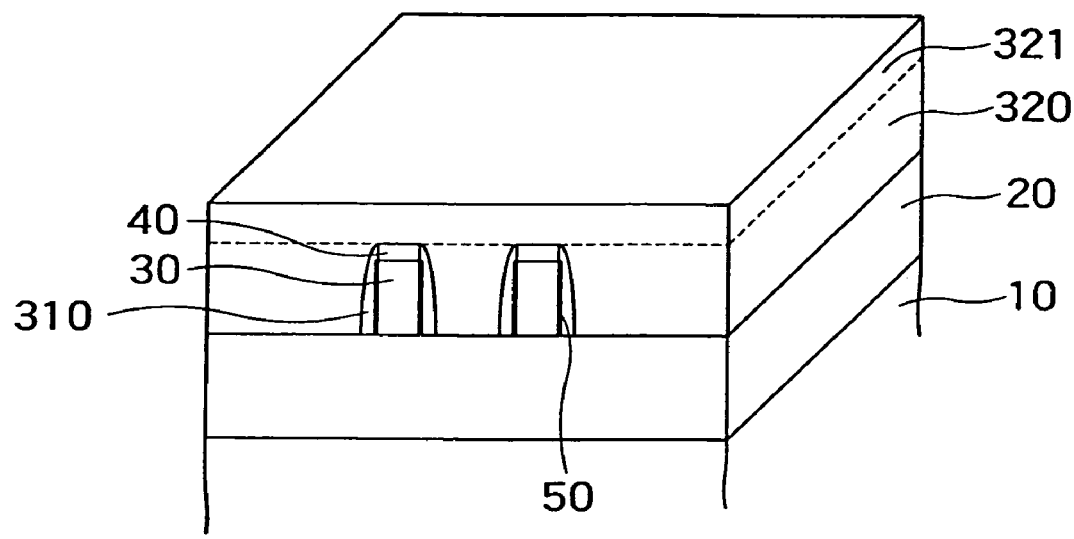

FIGS. 16 to 18 are perspective views showing a manufacturing method of the semiconductor device according to the third embodiment of the present invention. First, a Fin 30 and a protective film 40 are formed on a BOX layer 20 likewise the first embodiment (refer to FIG. 1). Next, after a gate insulation film 50 is formed, a polysilicon film 310 is deposited to a thickness of about 50 nm as a gate electrode material. Subsequently, as shown in FIG. 16, the polysilicon film 310 remains on side surfaces of the Fin 30 by anisotropically etching the polysilicon film 310. The polysilicon film 310 formed on the side surfaces of the Fin 30 acts as a gate electrode at a subsequent step.

Next, as shown in FIG. 16, a SiGe film 320 is deposited to a thickness of an about 300 nm. The SiGe film 320 has a germanium concentration of about 30%. At the time, since the SiGe film 320 is deposited so as to cover the Fin 30, a large step is formed on the surface of the SiGe film 320 according to a step of the Fin 30 as shown in FIG. 16. It is difficult to form a resist pattern of a gate electrode on the surface of the stepped SiGe film 320.

To cope with this problem, the SiGe film 320 is flattened by CMP and etched back until the silicon nitride film 40 is exposed as shown in FIG. 17. Next, as shown in FIG. 18, a SiGe film 321 is deposited again. At the time, the SiGe film 321 has a thickness of, for example, about 50 nm. The SiGe film 321 has a germanium concentration of about 30%.

Figure 19:
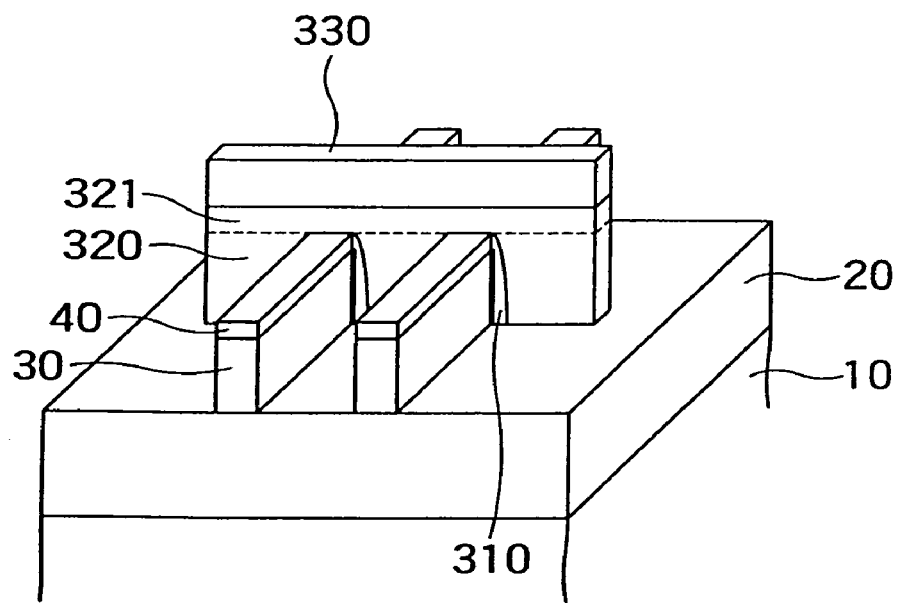

Next, silicon nitride film 330 used as a hard mask is deposited on the SiGe film 321 to a thickness of about 100 nm. As shown in FIG. 19, the silicon nitride film 330 is formed into the gate electrode pattern using lithography and RIE. Next, the SiGe films 320 and the 321 are etched by RIE using the silicon nitride film 330 as the hard mask after it is patterned. With these steps, the SiGe films 320 and 321, which have the same shape as the gate electrode are formed so as to cover both the side surfaces and the upper surface of a body region (channel region) of the Fin 30 as shown in FIG. 19.

Figure 20:
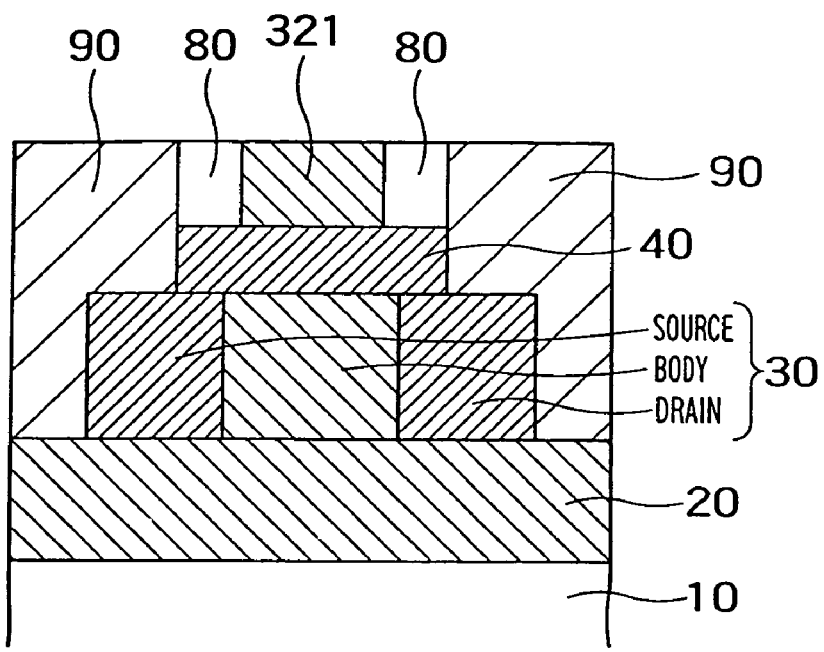
FIG. 20A is a cross-sectional view corresponding to a cross section taken along the line A-A of FIG. 7 showing a manufacturing method according to the third embodiment.
FIG. 20B is a cross-sectional view corresponding to a cross section taken along the line B-B of FIG. 7 showing a manufacturing method according to the third embodiment.
Figure 20:
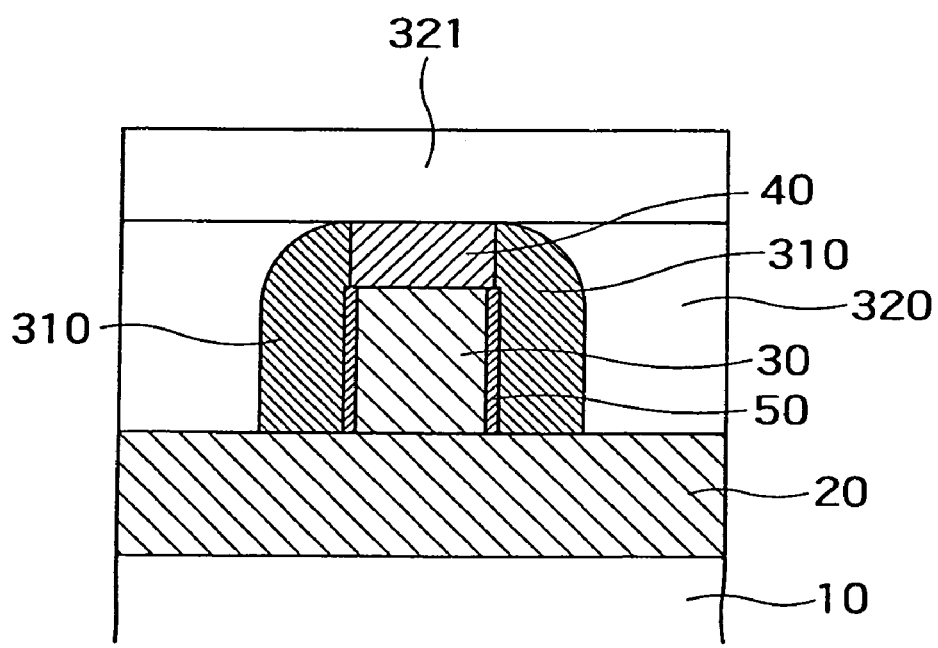
Figure 21:
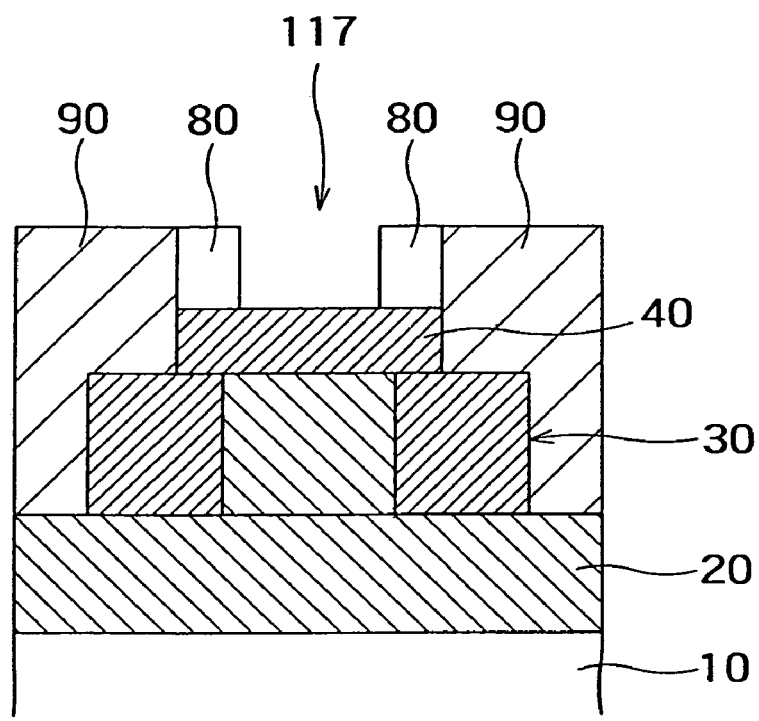
FIG. 21A is a cross-sectional view showing the manufacturing method following FIG. 20A.
FIG. 21B is a cross-sectional view showing the manufacturing method following FIG. 20B.
Figure 21:
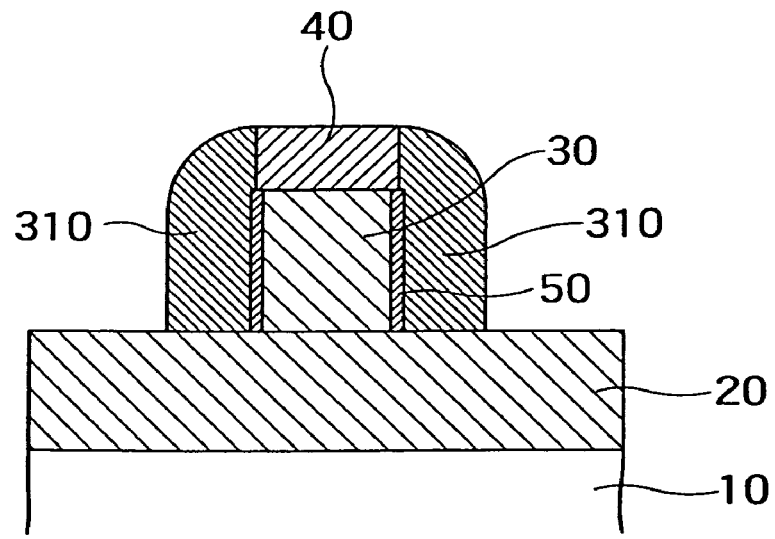
Figure 22:
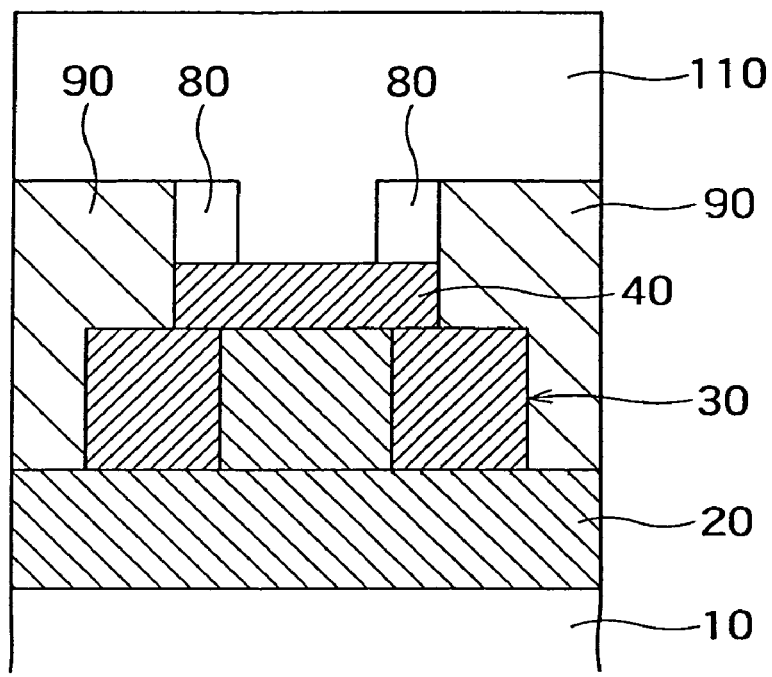
FIG. 22A is a cross-sectional view showing the manufacturing method following FIG. 21A.
FIG. 22B is a cross-sectional view showing the manufacturing method following FIG. 21B.
Figure 22:
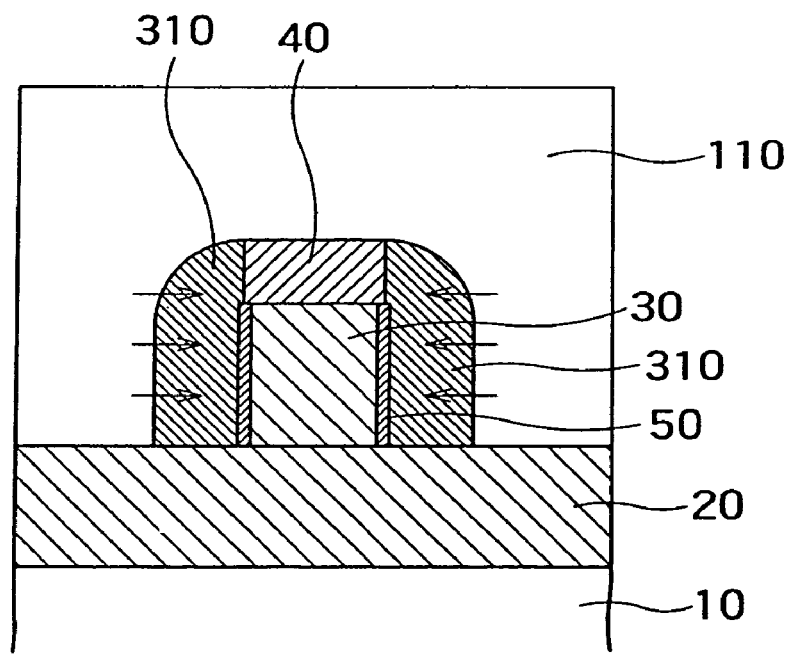
Figure 23:
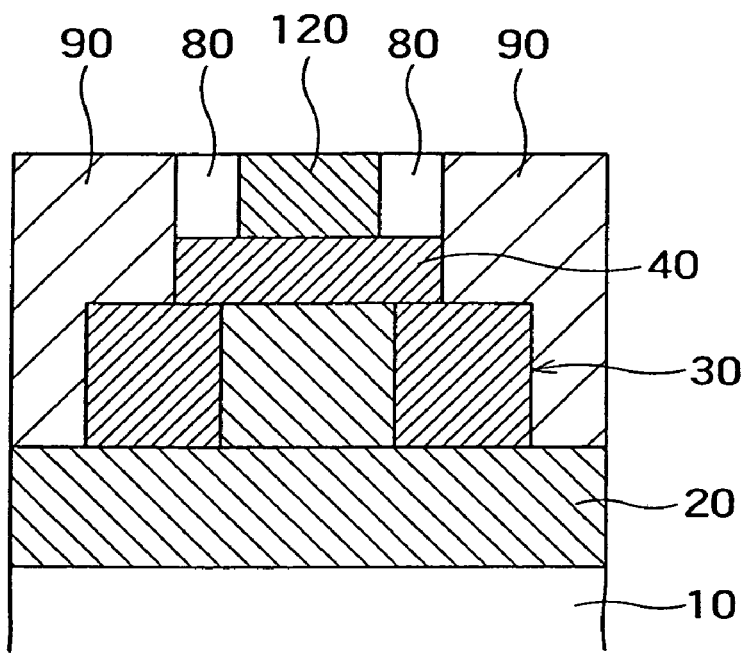
FIG. 23A is a cross-sectional view showing the manufacturing method following FIG. 22A.
FIG. 23B is a cross-sectional view showing the manufacturing method following FIG. 22B.
Figure 23:
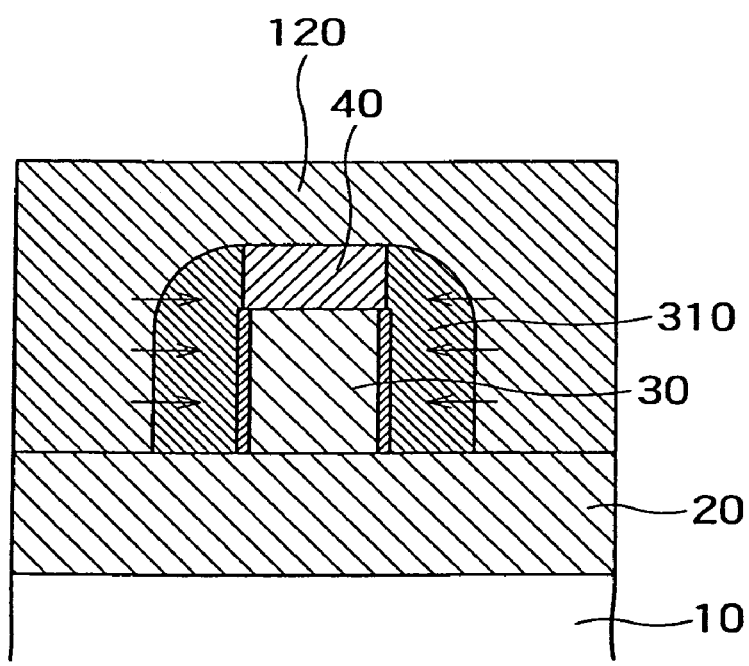

Thereafter, the same steps as those shown in FIGS. 6 and 7 are carried out. When the gate side wall film 80 is formed to a structure shown in FIG. 19, since the polysilicon film 310 is covered, a subsequent perspective view of the third embodiment is the same as those of FIGS. 6 and 7. Figures of the third embodiment corresponding to FIGS. 6 and 7 are omitted. However, in FIG. 7, the surface of the SiGe film 321 is exposed in place of the gate electrode 62. FIGS. 20A, 21A, 22A, and 23A are cross-sectional views corresponding to a cross section taken along the line A-A of and FIG. 7. FIGS. 20B, 21B, 22B and 23B are cross-sectional views corresponding to a cross section taken along the line B-B of FIG. 7. Subsequent manufacturing steps will be described referring to FIG. 20A to FIG. 23B. When the upper surface of the SiGe film 321 is exposed by CMP or the like, a structure shown in FIGS. 20A and 20B are obtained.

Next, the SiGe films 320 and 321 are selectively removed by wet etching. With this step, a trench 117 is formed on the upper surface of the protective film 40 as well as the upper and side surfaces of the gate electrode 310 are exposed as shown in FIGS. 21A and 21B. It is desired here to pay attention to that the side surfaces of the gate electrode 310 is exposed.

Subsequently, as shown in FIGS. 22A and 22B, a metal layer 110 made of, for example, nickel is deposited on the gate electrode 310. Next, the gate electrode 310 made of the polysilicon is fully silicided by heat-treating a structure shown in FIGS. 22A and 22B. With this treatment, the gate electrode 310 is changed to nickel silicide (NiSi). At this time, the gate electrode 310 is silicided from the side surfaces thereof as shown by arrows shown in FIG. 22B. With this treatment, the silicon concentration and the nickel concentration are made approximately constant in the gate electrode 310 regardless of the position of a channel. That is, the ratio of the silicon concentration and the nickel concentration are made approximately constant from the upper portion to the lower portion of the polysilicon film 310, respectively. Next, as shown in FIGS. 23A and 23B, a conductor 120 is filled in the positions, at which the SiGe films 320 and 321 were formed, by a damascene process. That is, a trench 117 is filled with the conductor 120, and the conductor 120 is deposited on the side surfaces of the gate electrode 310. More specifically, after the conductor 120 is deposited, it is flattened by CMP. The thickness of the conductor 120 is, for example, about 250 nm. With this arrangement, the conductor 120 remains in the trench 117.

According to the third embodiment, the gate electrode 310 is silicided from the side surfaces thereof. Accordingly, the portion of the gate electrode 310 in the proximity of the upper portion of the Fin 30 and the portion of the gate electrode 310 in the proximity of the lower portion thereof have approximately the same nickel concentration. Thus, the gate electrode 310 has an approximately equal work function in the lower portion and the upper portion of the Fin 30. As a result, since a threshold voltage of the transistor is stable, the dispersion of the threshold voltage is reduced and an S-factor is improved.

In the third embodiment, the trench 117 is formed on the protective film 40 likewise the second embodiment. Thus, the third embodiment has the same advantage as the second embodiment. It is needless to say that the third embodiment also has the advantage of the first embodiment.

Fourth Embodiment

A fourth embodiment is different from the first embodiment in that a gate electrode is patterned without fattening a gate electrode material.

FIG. 24 to FIG. 30B are cross-sectional views showing a manufacturing method of a semiconductor device according to the fourth embodiment of the present invention. FIGS. 25B, 26B, 27B, 28B, 29B, and 30B are views when structures shown in FIGS. 25A, 26A, 27A, 28A, 29A, and 30A are observed from any of right and left sides.

Figure 24:
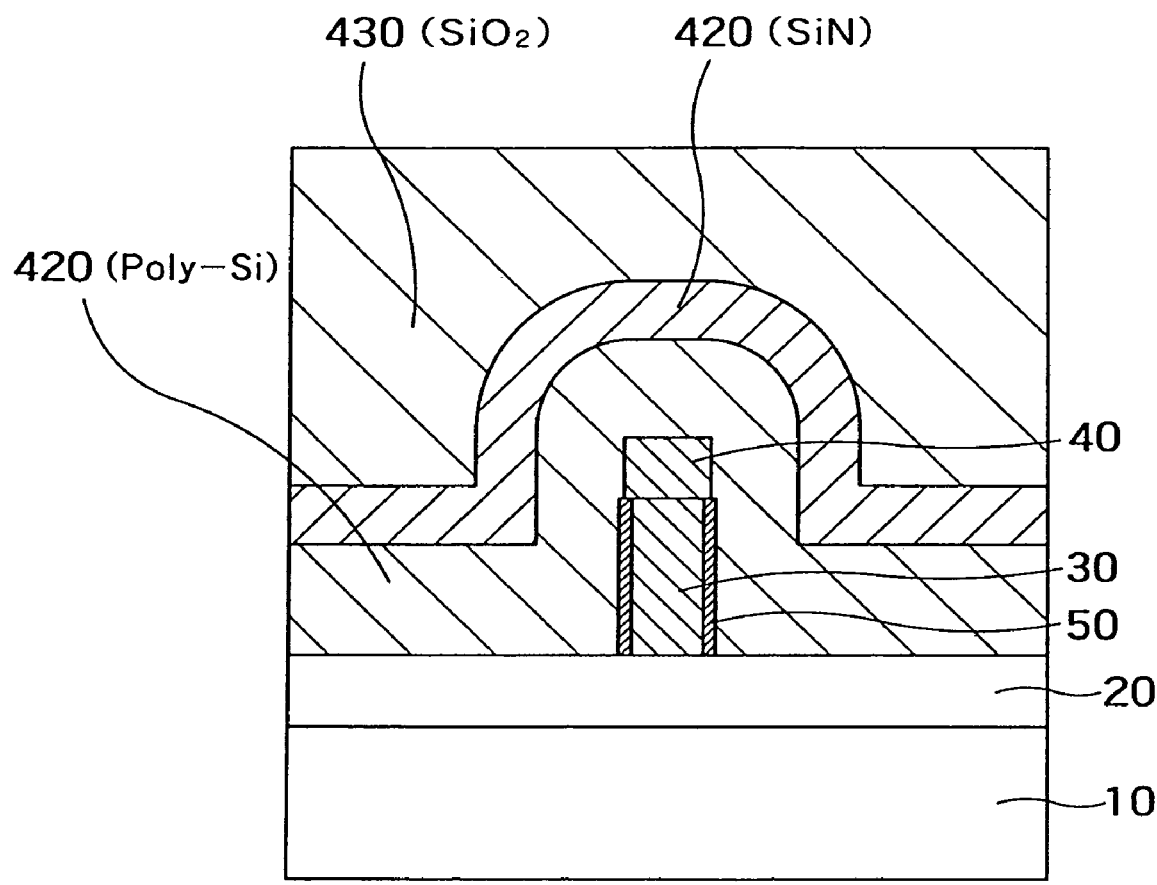
Figure 25:
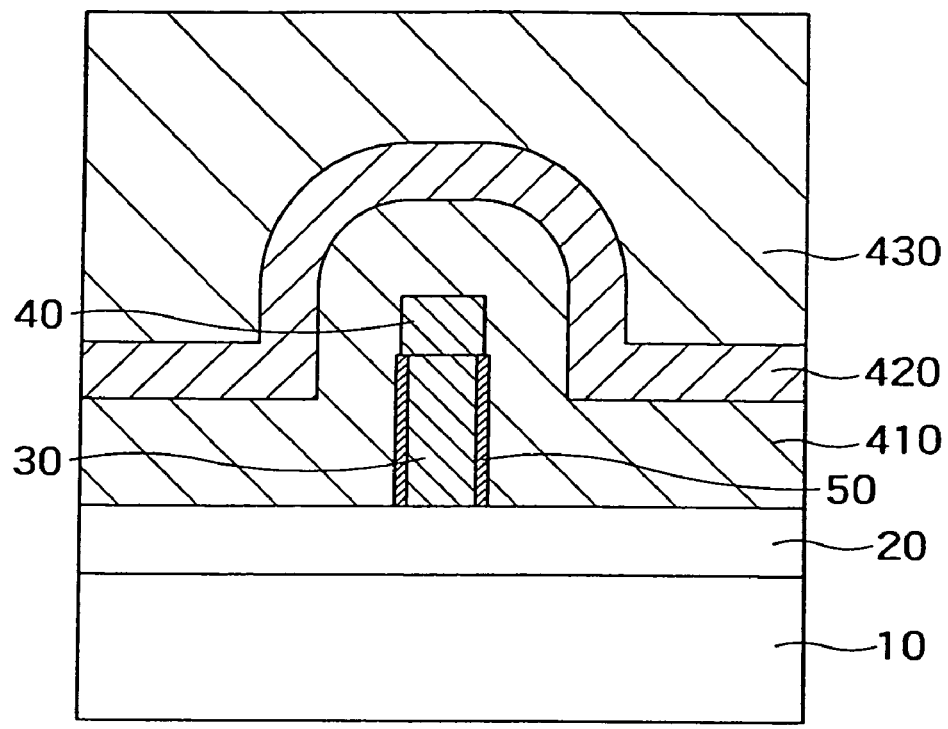
Figure 25:
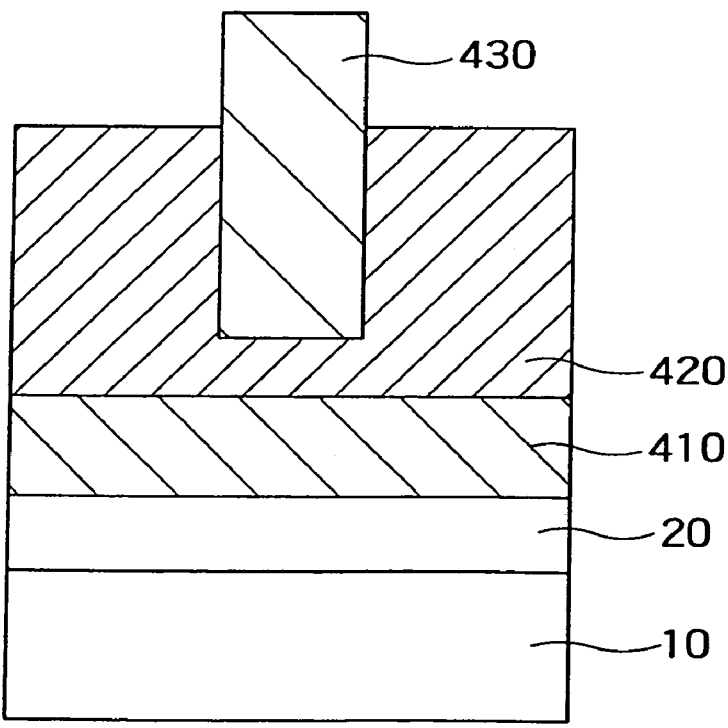
Figure 26:
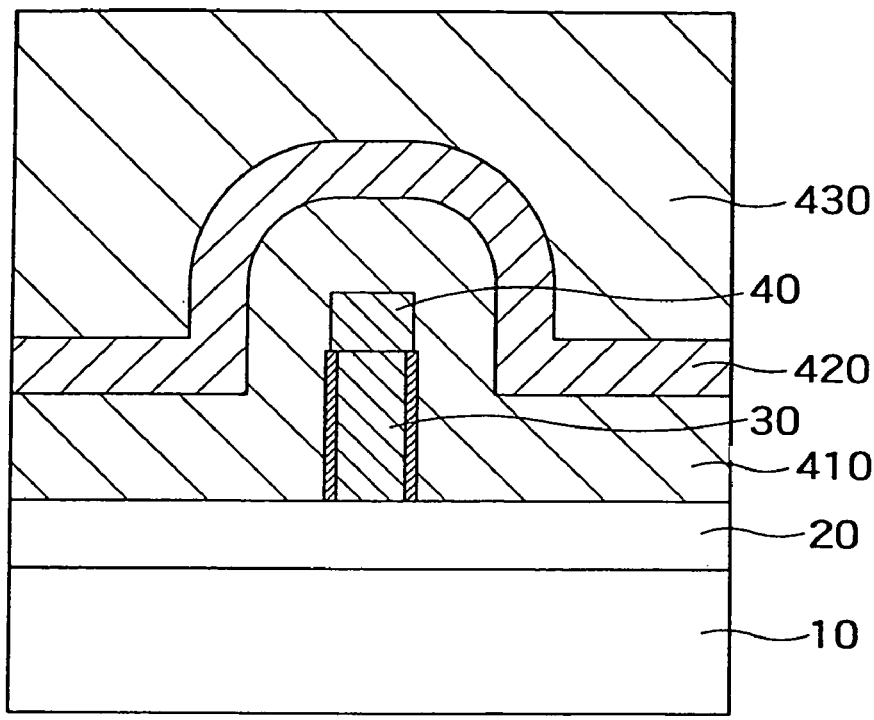
Figure 26:
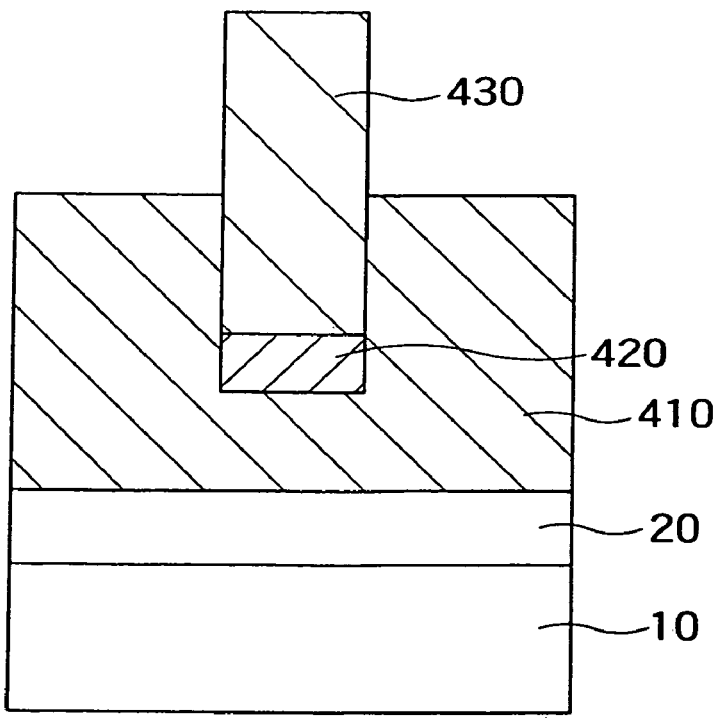
Figure 27:
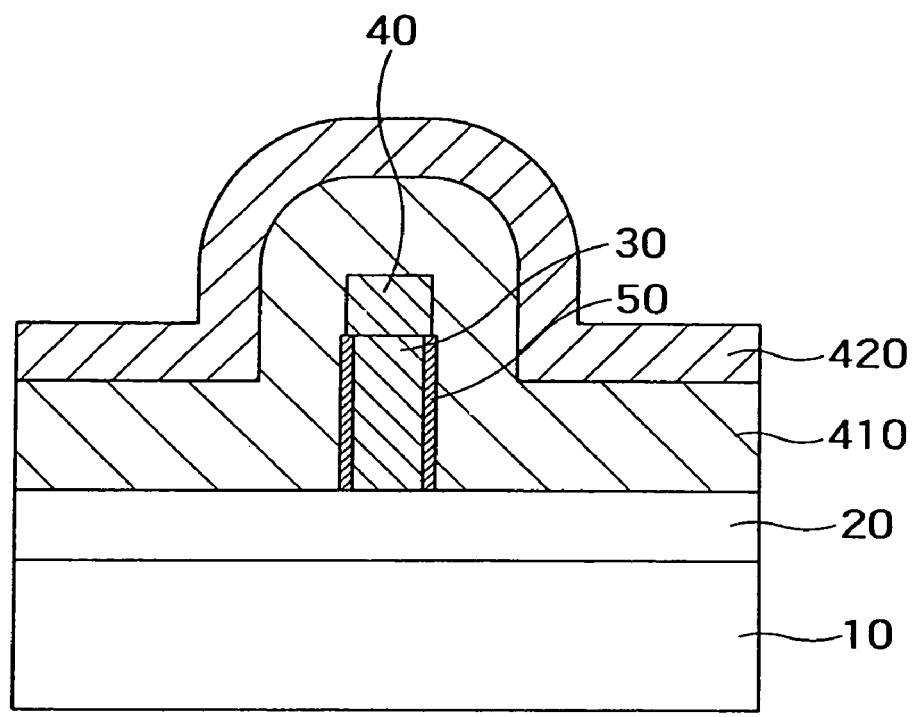
Figure 27:
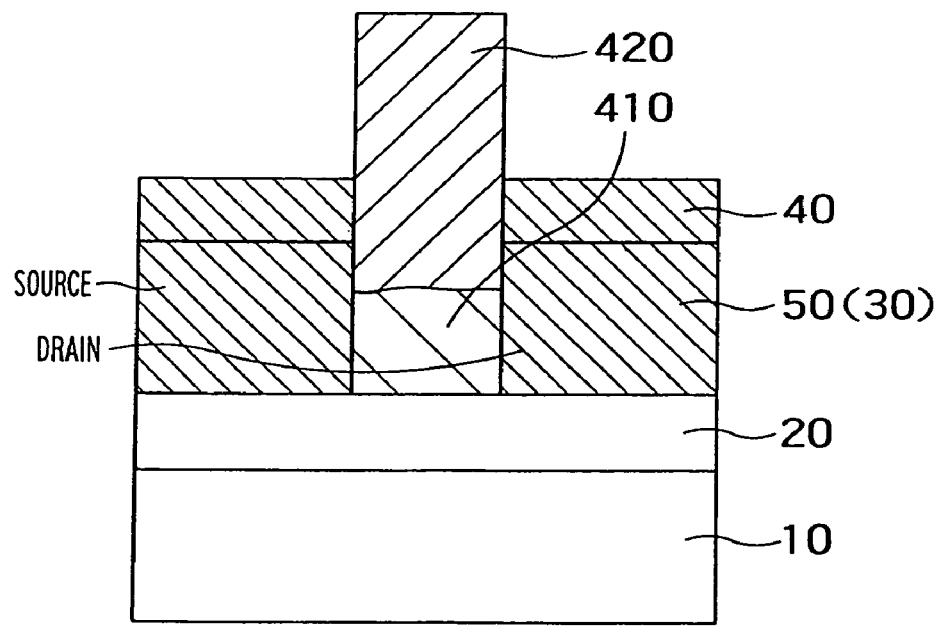
Figure 28:
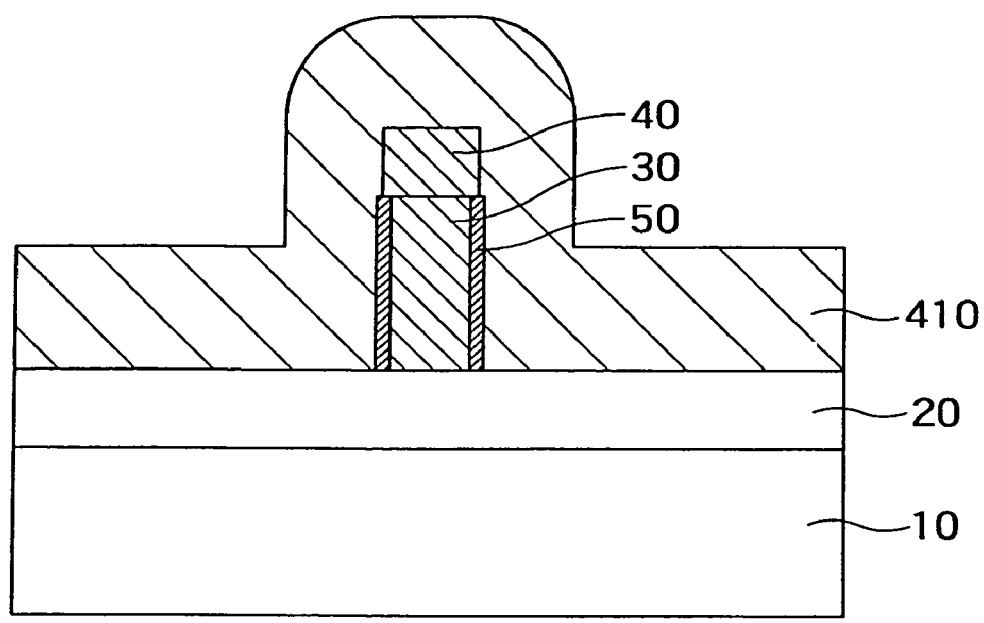
Figure 28:
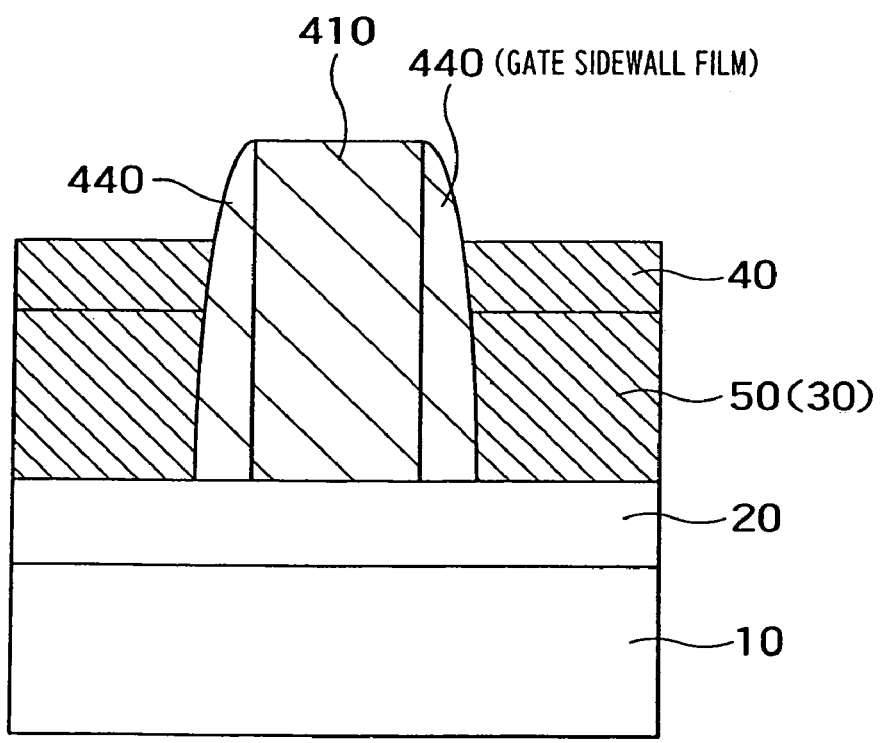
Figure 29:
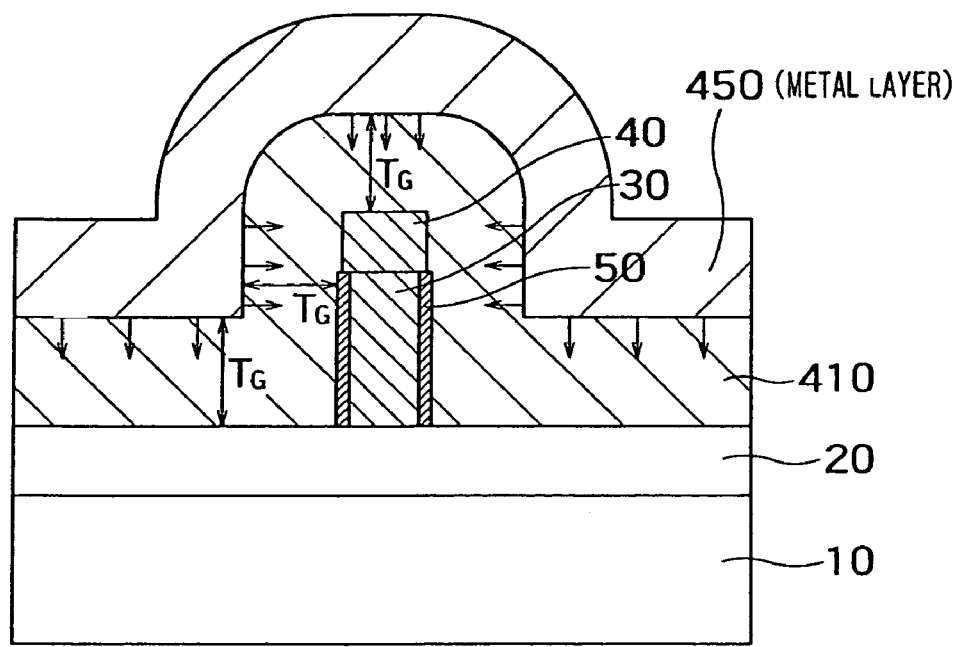
Figure 29:
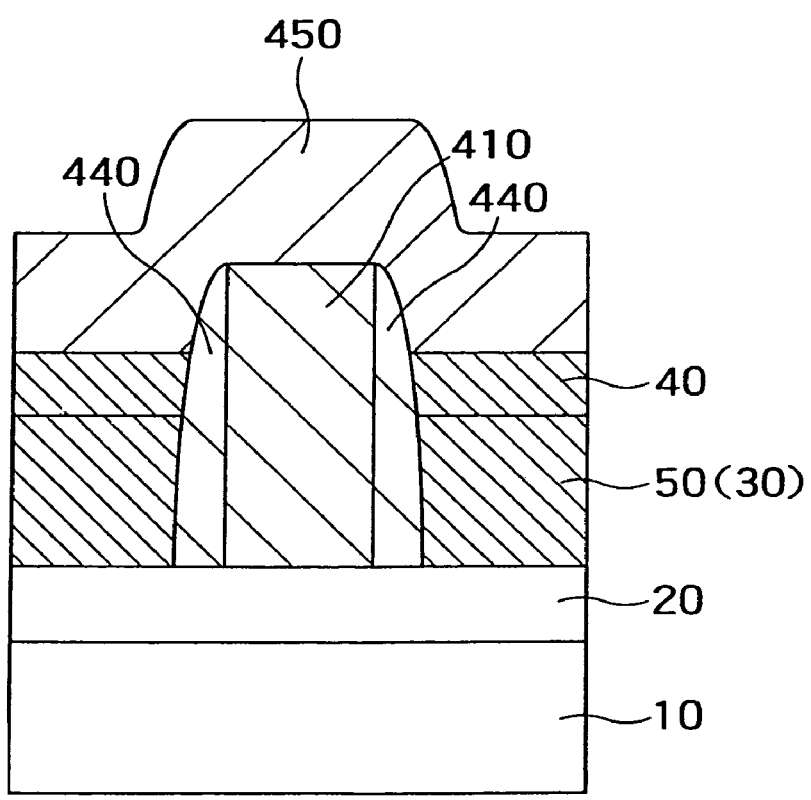
Figure 30:
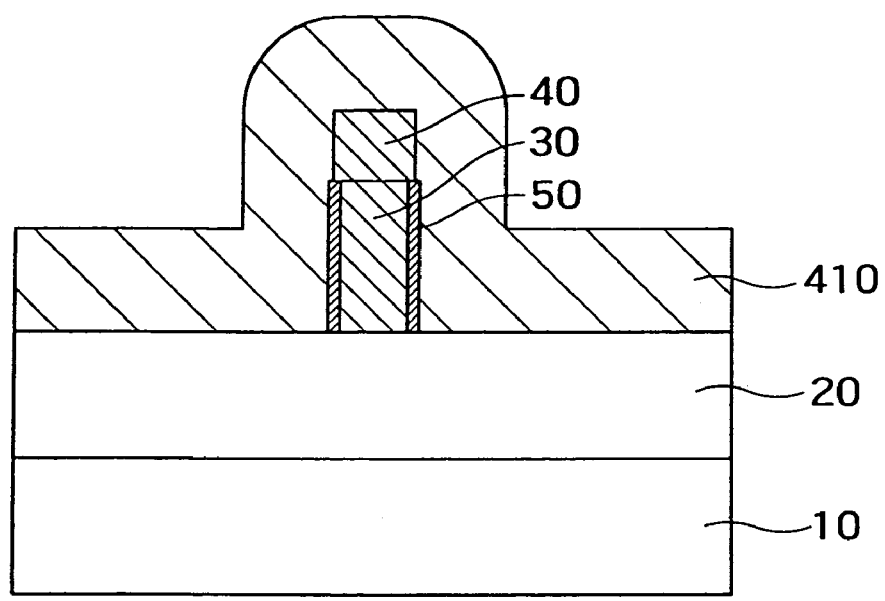
Figure 30:
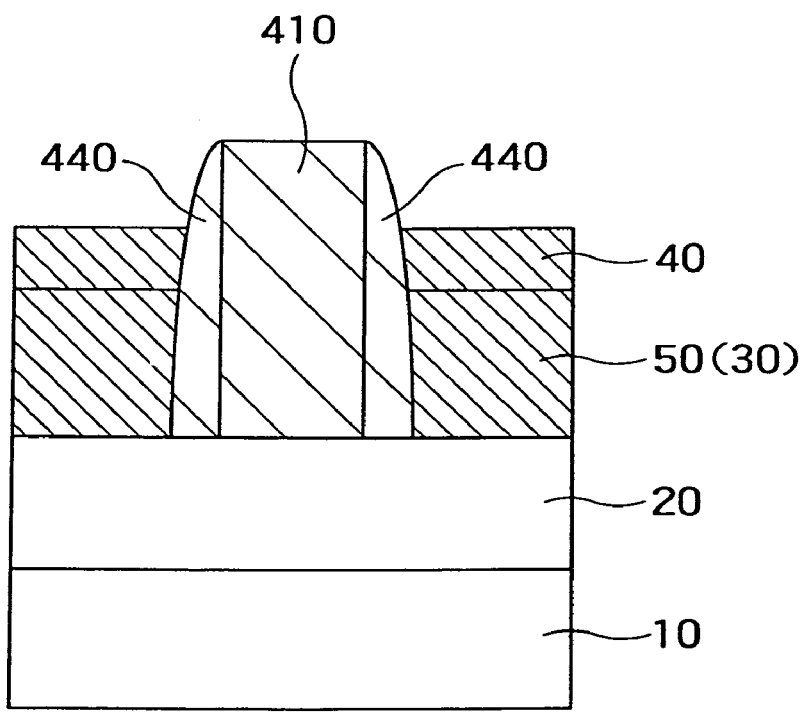

First, a Fin 30 and a protective film 40 are formed on a BOX layer 20 likewise the first embodiment. Next, a gate insulation film 50 is formed on side surfaces of a Fin 30. Subsequently, as shown in FIG. 24, a polysilicon film 410 as a gate electrode material is deposited so as to cover the Fin 30 and the protective film 40. The polysilicon film 410 has a thickness of, for example, 100 nm. The polysilicon film 410 is made to a gate electrode at a subsequent step. An amorphous silicon 410 may be deposited in place of the polysilicon film 410. Next, a silicon nitride film 420 as a first insulation film is deposited on the polysilicon film 410. The thickness of the conductor 420 is, for example, about 20 nm. The silicon nitride film 420 is used as a hard mask. Next, a silicon oxide film 430 as a second insulation film is deposited on the silicon nitride film 420. The thickness of the silicon oxide film 430 is, for example, about 150 nm. The silicon oxide film 430 is used also as a hard mask. Subsequently, the surface of the silicon oxide film 430 is flattened using CMP or the like. In this way, a structure shown in FIG. 24 is obtained.

Next, the silicon oxide film 430 is formed to a gate electrode pattern as shown in FIGS. 25A and 25B.

After a photoresist (not shown) is removed, the silicon nitride film 420 is etched by RIE or the like using the silicon oxide film 430 as the mask as shown in FIGS. 26A and 26B.

After the silicon oxide film 430 is removed, the polysilicon film 410 is etched by RIE or the like using the silicon nitride film 420 as the mask as shown in FIGS. 27A and 27B. Further, when the silicon nitride film is removed, the polysilicon film 410 remains in the gate electrode pattern. The polysilicon film 410 is also called a gate electrode 410.

Next, an impurity is implanted in the Fin 30 using the gate electrode 410 as the mask. Further, a source/drain diffusion layer is formed by carrying out a heat treatment. Next, a TEOS film is deposited as a material of a gate side wall material and etched by RIE. With this step, a gate side wall film 440 is formed on side surfaces of the gate electrode 410 as shown in FIG. 28B. Note that the implantation and the heat treatment for forming the source/drain diffusion layer may be carried out after forming the gate side wall film 440.

If necessary, the gate electrode 410 is subjected to a surface treatment. After the surface treatment, a metal film 450 composed of, for example, nickel film is deposited on the gate electrode 410 as shown in FIGS. 29A and 29B. The thickness of the metal film 450 is, for example, about 100 nm. Subsequently, a structure shown in FIGS. 29A and 29B is annealed at about 450° C. With this treatment, the metal film 450 reacts with the gate electrode 410, and the gate electrode 410 is made to nickel silicide. The gate electrode 410 made of polysilicon before silicidation is not flattened by CMP or the like. Accordingly, as shown in FIG. 29A, the gate electrode 410 covers the BOX layer 20, the Fin 30, and the like by an approximately uniform thickness TG. With this arrangement, the gate electrode 410 is silicided approximately uniformly as shown by an arrow of FIG. 29A. That is, the gate electrode 410 has an approximately uniform nickel concentration after the silicidation.

Next, an unreacted metal film 450 is removed using SPM (Sulfuric acid-Hydrogen Peroxide Mixture). With this treatment, the gate electrode 410 fully silicided is completed as shown in FIG. 30A and FIG. 30B. As described above, the gate electrode 410 has an approximately uniform nickel concentration and has no Ni rich silicide. Accordingly, when the unreacted metal film 450 is removed, the gate electrode 410 on the Fin 30 is not removed. As a result, the gate electrode 410 is not disconnected. Explanation of subsequent steps is omitted because they are the same as those of the first embodiment.

According to the fourth embodiment, the gate electrode 410 is formed by using the hard masks of the silicon nitride film 420 and the silicon oxide film 430. Thus, the gate electrode 410 can be processed without flattening it by CMP or the like. As a result, since the gate electrode 410 is fully silicided approximately uniformly, the gate electrode 410 is not removed, and the gate electrode 410 is not disconnected.

According to the fourth embodiment, two types of hard masks, that is, the silicon nitride film 420 and the silicon oxide film 430 are used. If only the silicon oxide film 430 is used as the hard mask, when the silicon oxide film 430 is removed after the gate electrode 410 is formed, the BOX layer 20 is removed together with the silicon oxide film 430. To prevent the disadvantage, the silicon nitride film 420 is provided as the hard mask for forming the gate electrode 410. Ordinarily, a hard mask is necessary to pattern the silicon nitride film 420. Thus, the silicon oxide film 430 is provided as the hard mask for forming the silicon nitride film 420.

If the hard mask can be removed without etching the BOX layer 20, any one of the silicon nitride film 420 and the silicon oxide film 430 may be used.

Fifth Embodiment

A fifth embodiment is different from the fourth embodiment in that a silicon germanium film 510 is used in place of the silicon nitride film 420 and the silicon oxide film 430.

Figure 31:
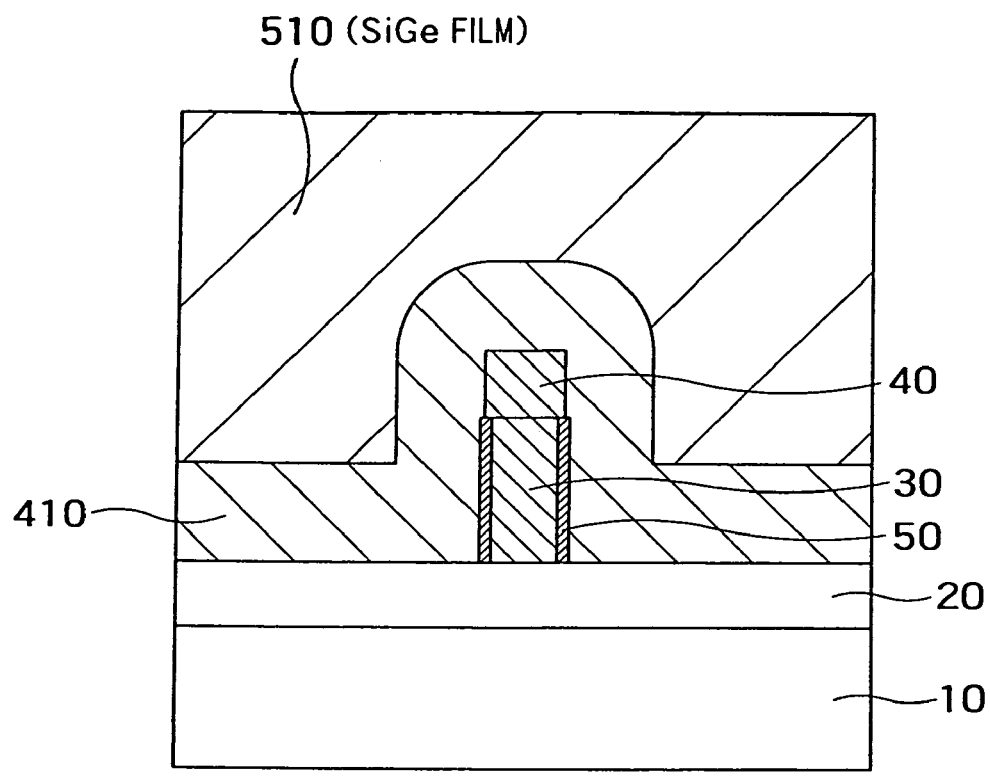
Figure 31:
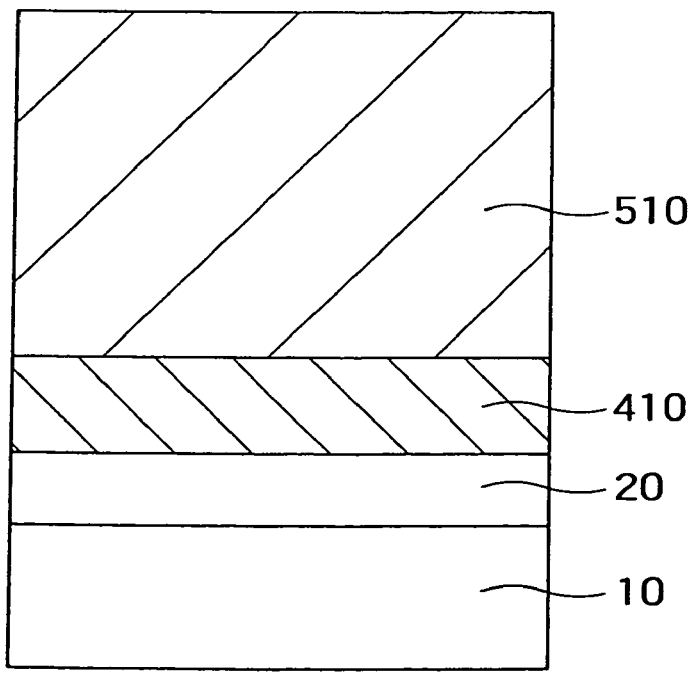
Figure 32:
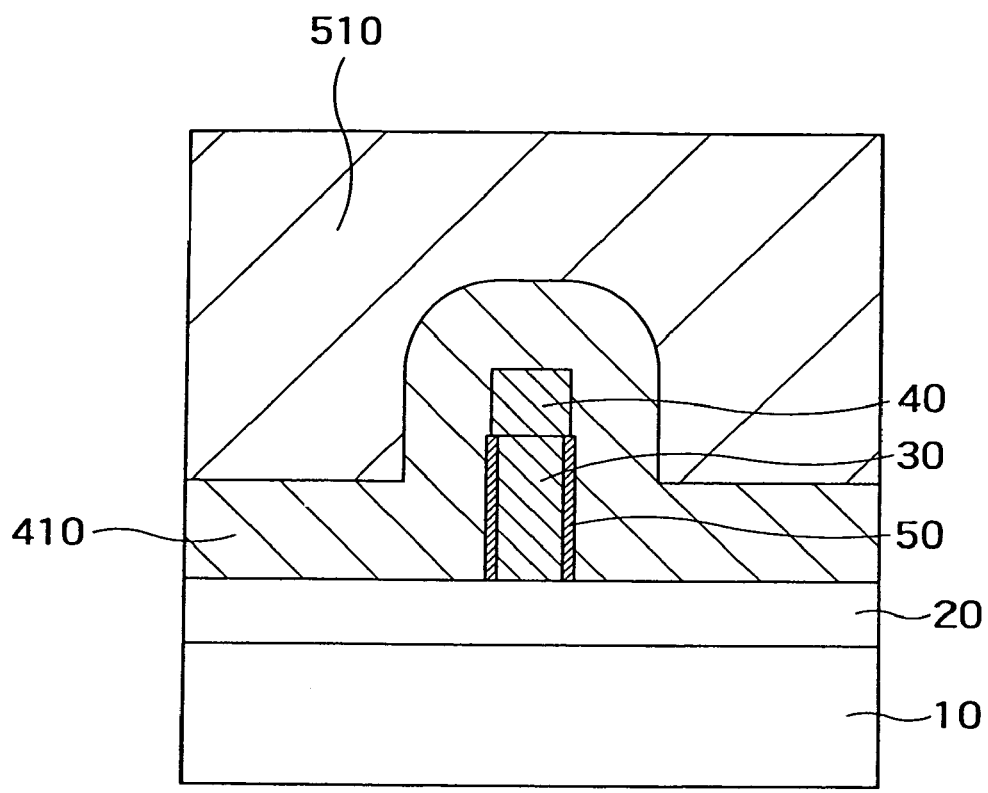
Figure 32:
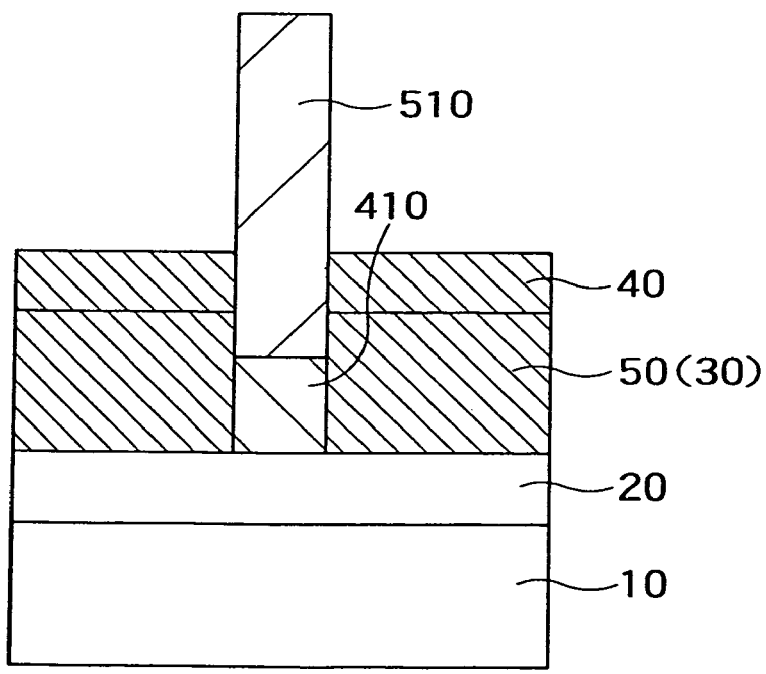

FIGS. 31 to 32 are cross-sectional views showing a manufacturing method of a semiconductor device according to a fifth embodiment of the present invention. FIG. 31B and FIGS. 31A and 32A are views when a structure shown in FIGS. 31A and 32A is observed from any of right and left sides.

First, a Fin 30 and a protective film 40 are formed on a BOX layer 20 likewise the first embodiment. Next, a gate insulation film 50 is formed on side surfaces of the Fin 30. Subsequently, as shown in FIGS. 31A and 31B, a polysilicon film 410 as a gate electrode material is deposited so as to cover the Fin 30 and the protective film 40. An amorphous silicon film 410 may be deposited in place of the polysilicon film 410.

Next, a (silicon germanium) SiGe film 510 as a mask insulation film is deposited on the polysilicon film 410. The thickness of the SiGe film 510 is, for example, about 200 nm. The SiGe film 510 is used as a hard mask. Next, the surface of the SiGe film 510 is flattened using CMP or the like.

Then, a gate electrode pattern is formed to the SiGe film 510 using lithography and RIE. After a photoresist (not shown) is removed, the polysilicon film 410 is etched by RIE or the like using the SiGe film 510 as the mask as shown in FIGS. 32A and 32B. At the time, the SiGe film 510 and the polysilicon film 410 may be continuously processed to the gate electrode pattern at the same process step. Further, when the SiGe film 510 is selectively removed, the polysilicon film 410 remains in a state that it is processed to the gate electrode pattern. The SiGe film 510 can be selectively removed to a silicon oxide film. Accordingly, the SiGe film 510 can be removed without etching the BOX layer 20.

Explanation of subsequent steps is omitted because they are the same as those of the fourth embodiment.

According to the fifth embodiment, the gate electrode 410 is formed using the single layer hard mask made of the SiGe film 510 without flattening the gate electrode 410 by CMP or the like. The single layer hard mask can be more easily processed than the double layer hard mask of the fourth embodiment. Accordingly, in the fifth embodiment, the gate electrode 410 can be formed by relatively simple manufacturing steps. Further, the fifth embodiment has the same advantage as the fourth embodiment.

Sixth Embodiment

In a sixth embodiment, when a Fin is formed, a conductor is previously formed on the Fin. With this arrangement, a gate electrode can be prevented from being disconnected above the Fin.

FIGS. 33 to 41 are cross-sectional views showing a manufacturing method of a semiconductor device according to the sixth embodiment of the present invention. FIGS. 39B, 40B, and 41B are views when structures shown in FIGS. 39A, 40A, and 41A are observed from any of right and left sides, respectively.

Figure 33:
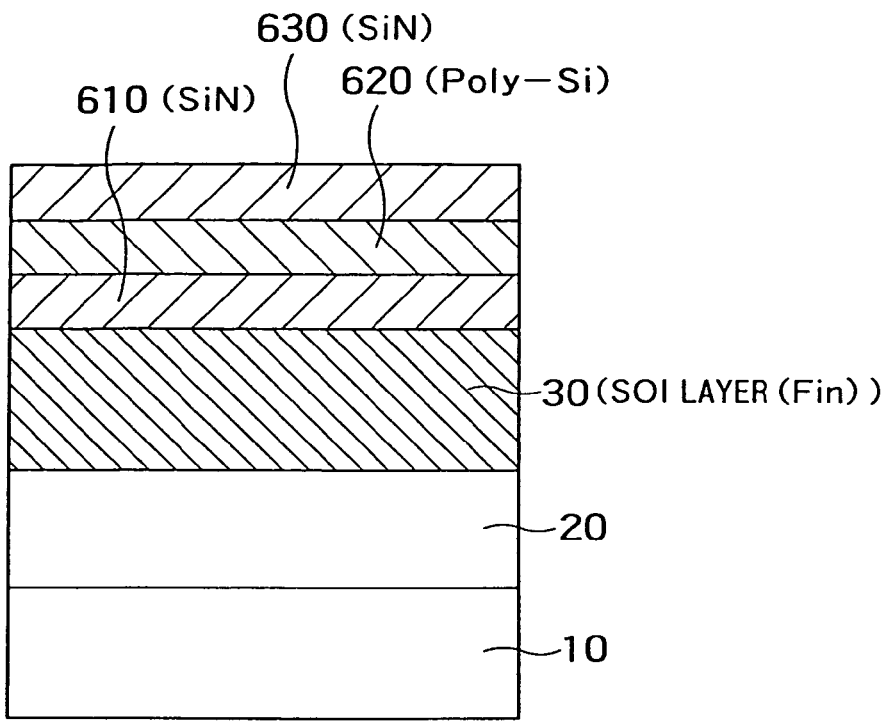

First, a silicon nitride film 610 as a first insulation film is deposited on an SOI layer. Next, a polysilicon film 620 as a conductor is deposited on the silicon nitride film 610. Subsequently, a silicon nitride film 630 as a second insulation film is deposited on the polysilicon film 620. With these steps, a structure shown in FIG. 33 is obtained. The silicon nitride film 610 insulates between the polysilicon film 620 and the Fin 30. The polysilicon film 620 connects between the portions of a gate electrode formed right and left of the Fin 30 at subsequent step. The silicon nitride film 630 is used as a hard mask.

Figure 34:
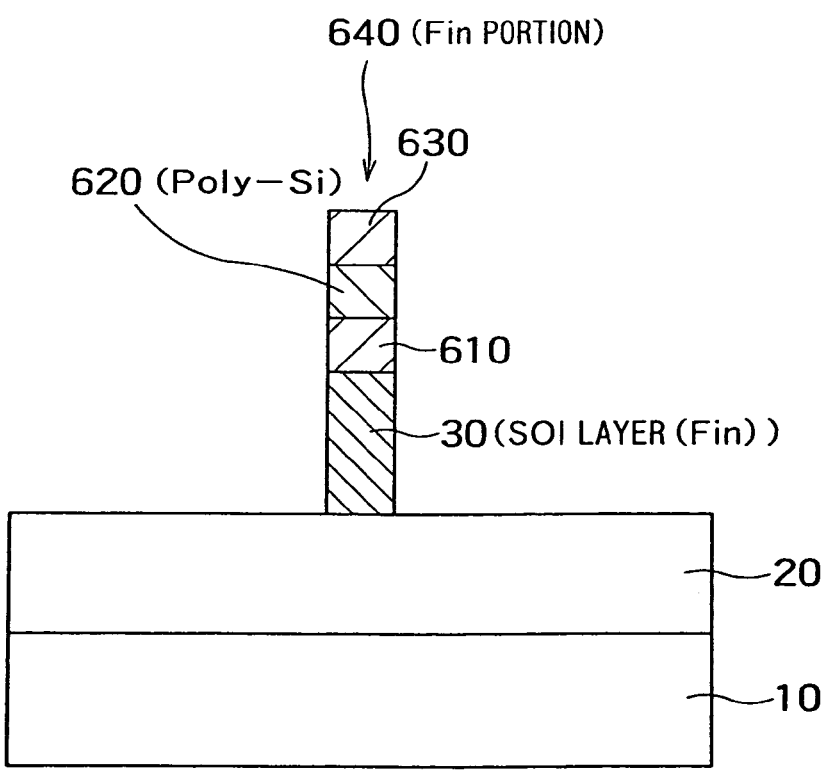

Next, the silicon nitride film 630 is formed to a Fin pattern by using lithography and RIE. Then, the polysilicon films 620, the silicon nitride film 610, and the SOI layer 30 are etched by RIE using the patterned silicon nitride film 630 as the hard mask. In this way, a Fin portion 640 is formed as shown in FIG. 34. The patterned SOI layer is used as a body of the Fin. Accordingly, the patterned SOI layer 30 is also called a Fin 30.

Figure 35:
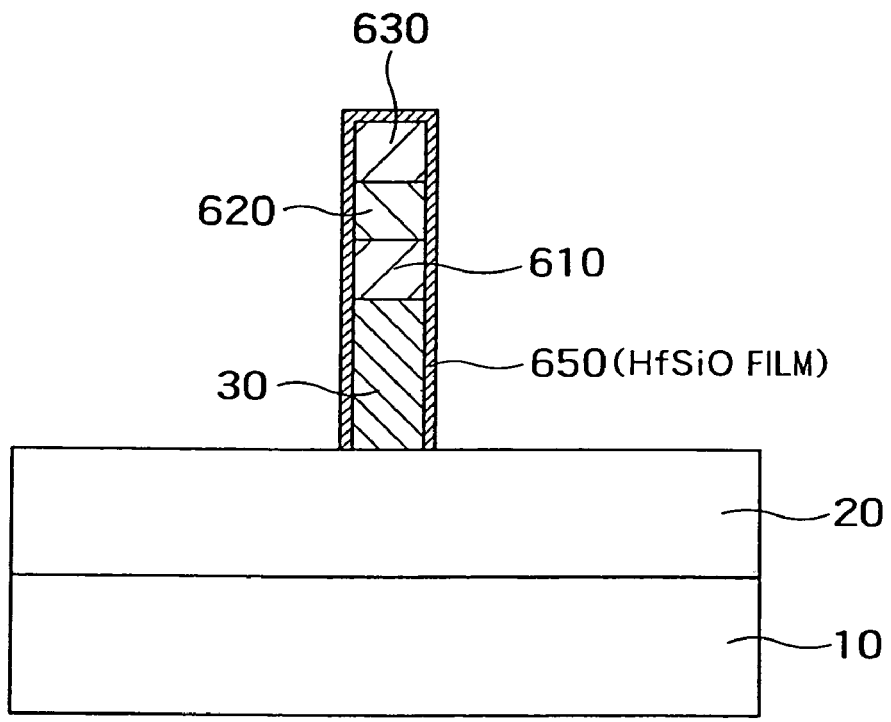
Figure 36:
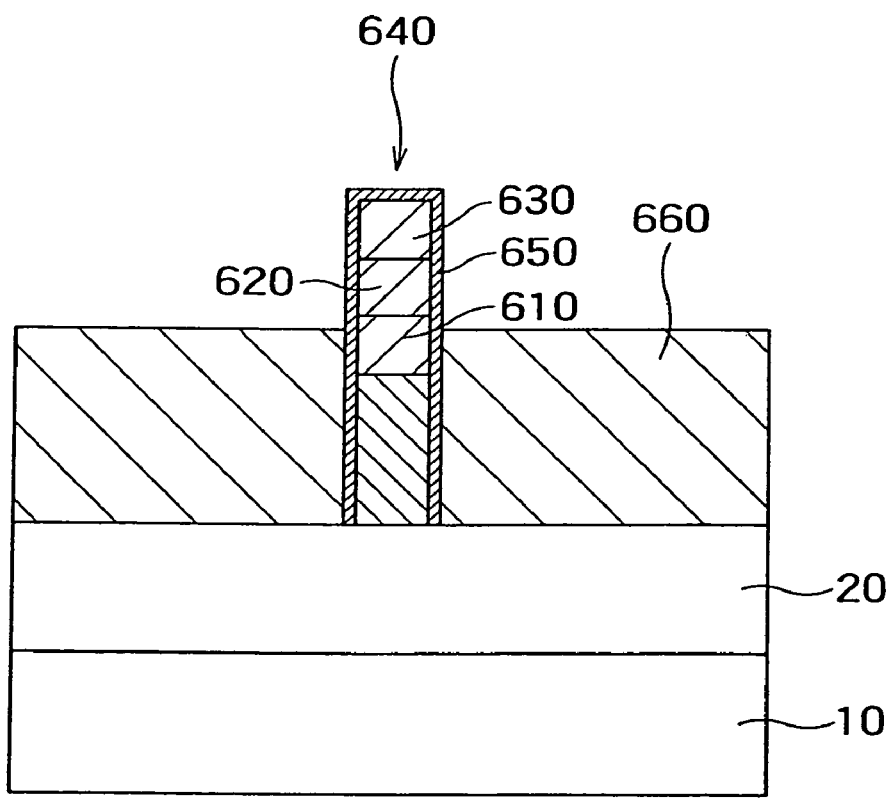

Next, as shown in FIG. 35, a hafnium silicate (HfSiO) film, for example, is deposited as a gate insulation film 650 so as to cover the Fin portion 640. Note that the gate insulation film 650 may be a silicon oxide film formed by oxidizing the Fin portion 640.

Next, a polysilicon film 660 is deposited so as to cover the Fin portion 640. The polysilicon film 660 is etched back using RIE, CDE, or the like up to or below the bottom surface level of the polysilicon film 620. With this treatment, the gate insulation film 650 that covers the side surfaces of the polysilicon film 620 is exposed.

Figure 37:
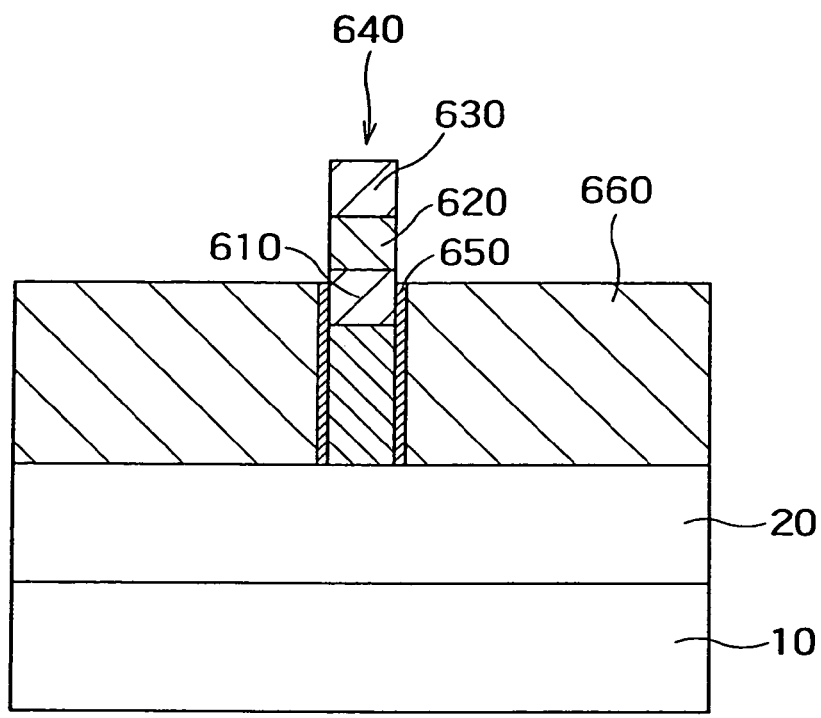
Figure 38:
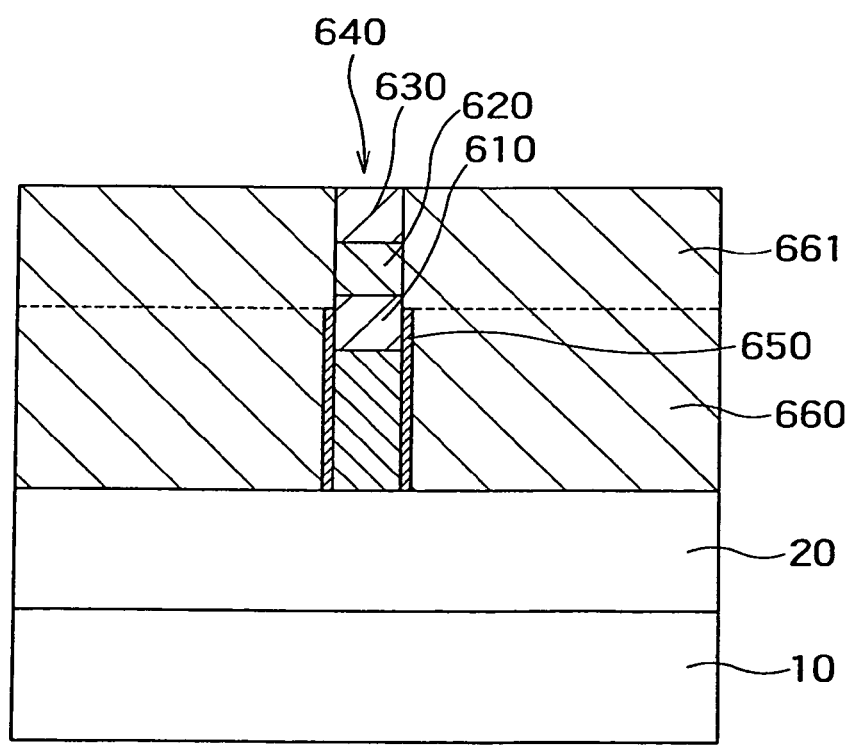
Figure 39:
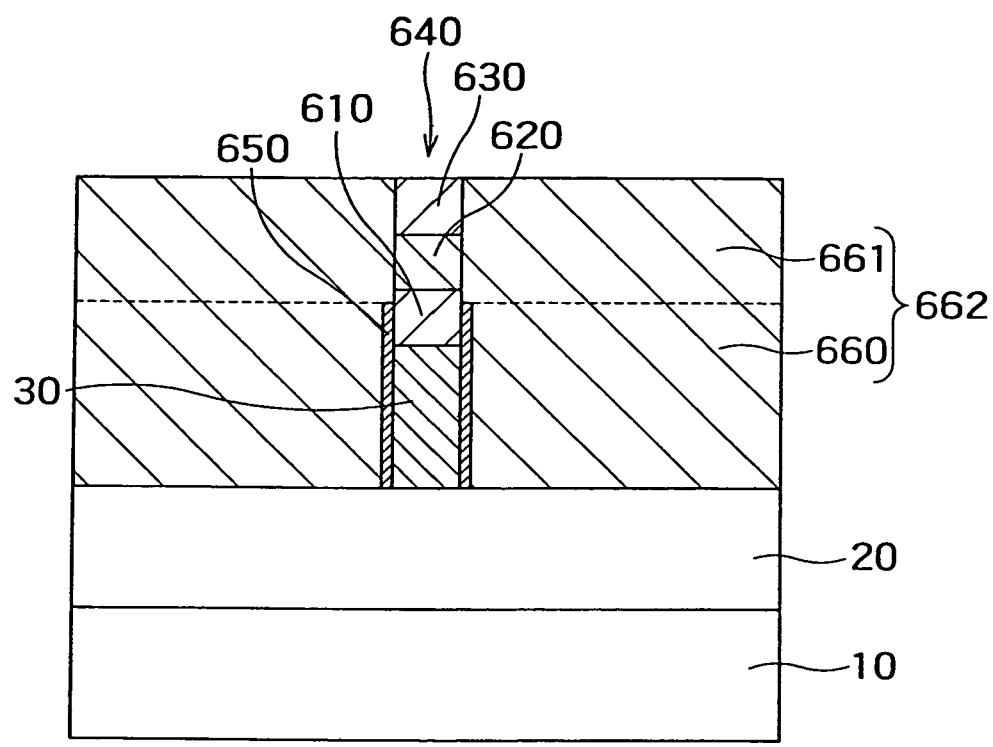
Figure 39:
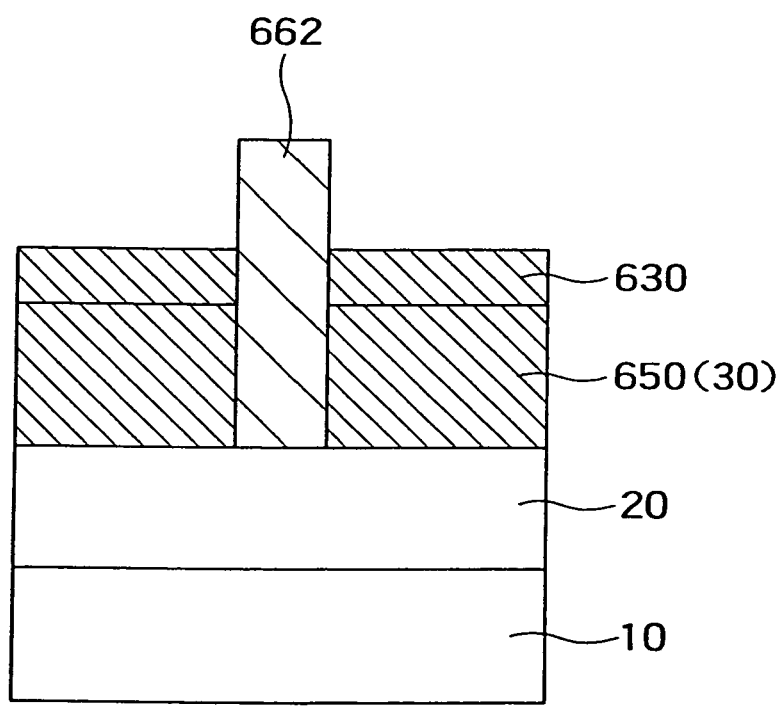

As shown in FIG. 37, the exposed gate insulation film 650 is removed and the side surfaces of the polysilicon film 620 are exposed. After the side surfaces of the polysilicon film 620 are rinsed, a polysilicon film 661 is deposited again so as to cover the Fin portion 640. Otherwise, silicon is epitaxially grown so as to cover the Fin portion 640. As shown in FIG. 38, the thus formed polysilicon film 661 is integrated with the polysilicon film 660 and the polysilicon film 620.

Next, the surface of the polysilicon film 661 is flattened using CMP or the like. At the time, although the silicon nitride film 630 is exposed, the polysilicon film 620 remains in a state that it is covered with the silicon nitride film 630.

Next, the polysilicon films 661 and 660 are processed to the gate electrode pattern. With this treatment, a gate electrode 662 is formed as shown in FIGS. 39A and 39B.

Figure 40:
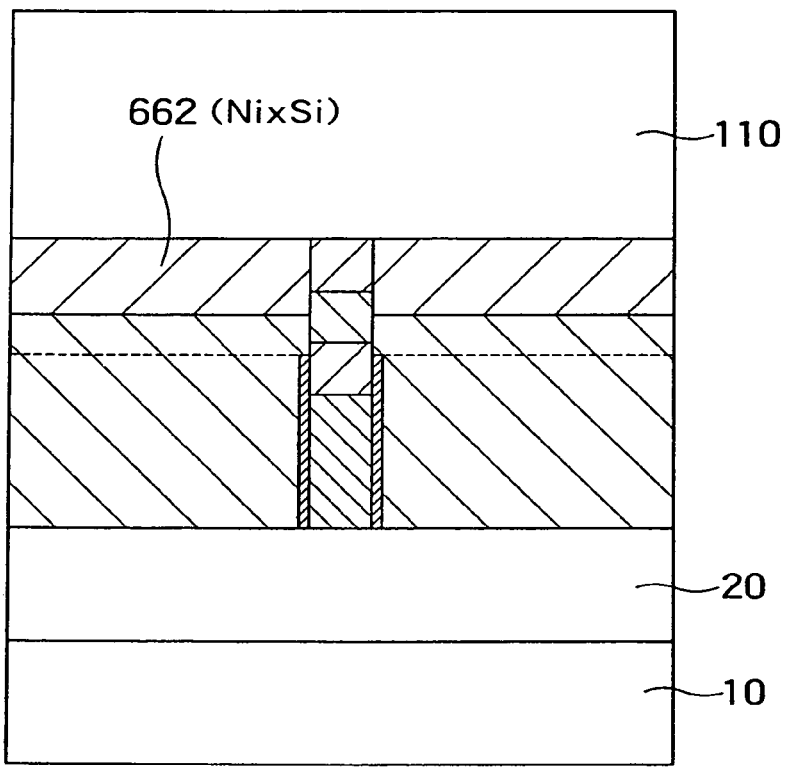
Figure 40:
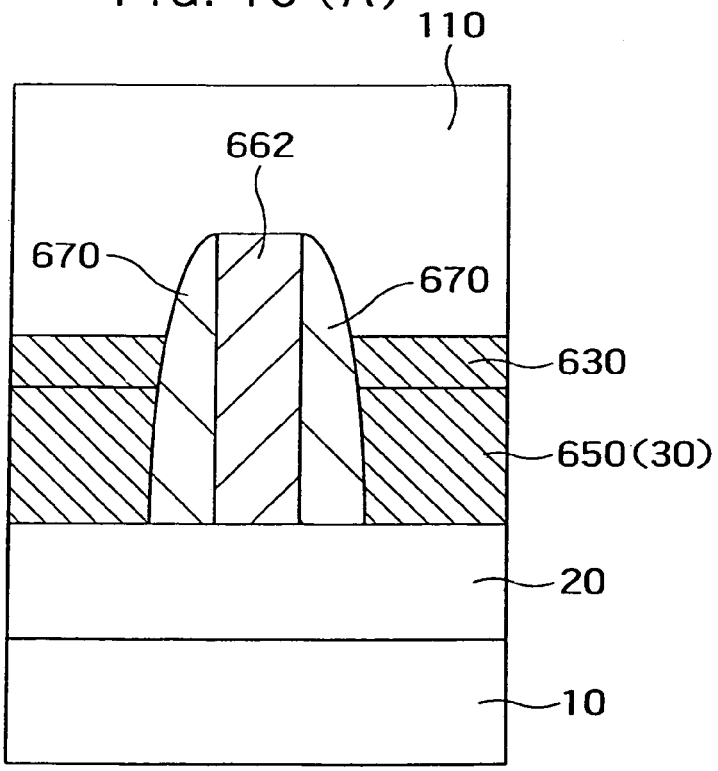
Figure 41:
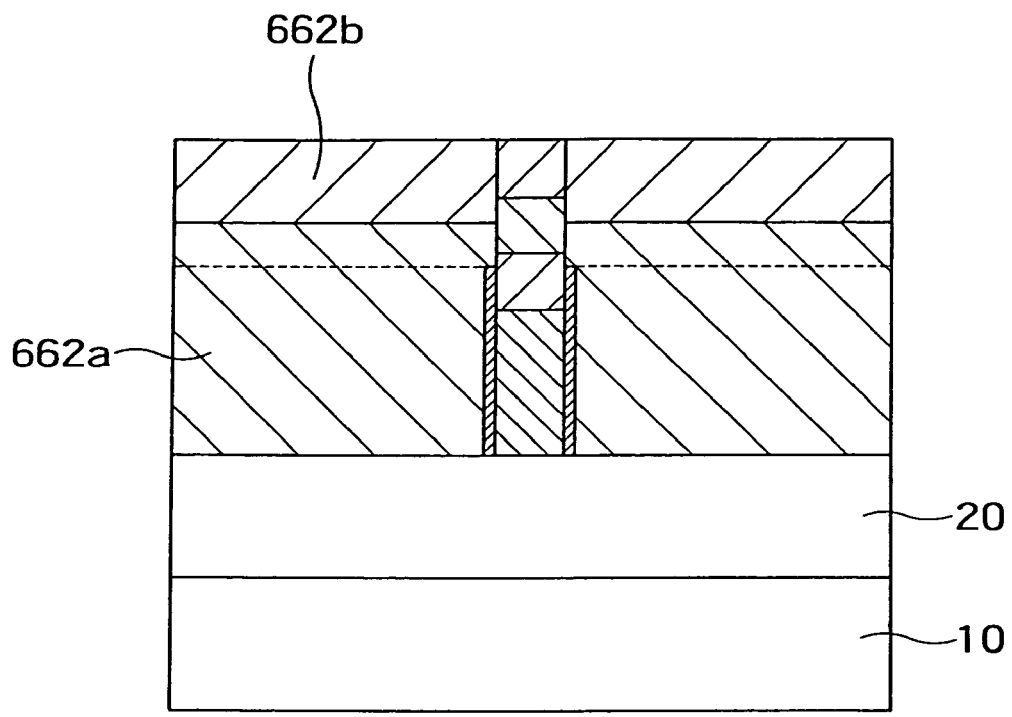
Figure 41:
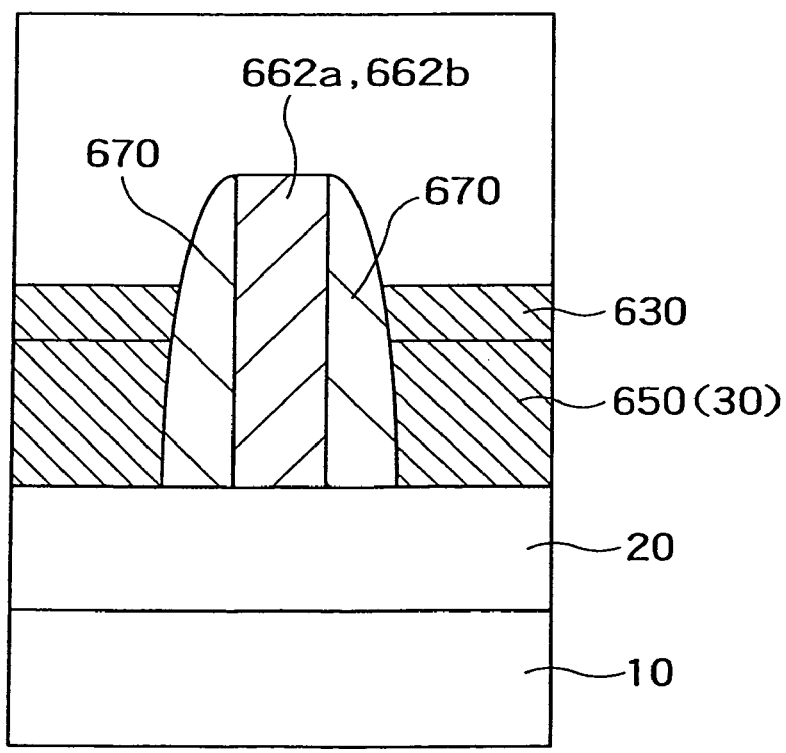

Then, as shown in FIG. 40, side wall surfaces 670 are formed on side surfaces of the gate electrode 662. The side wall surfaces 670 are made of, for example, TEOS films. An impurity is implanted in the Fin 30, and further the Fin 30 is annealed, thereby a source/drain diffusion layer is formed. If necessary, the gate electrode 662 is subjected to a surface treatment. After the surface treatment, a metal film 110 made of, for example, nickel is deposited on the gate electrode 662. The thickness of the metal film 110 is, for example, about 100 nm. With these treatments, a structure shown in FIGS. 40A and 40B is obtained. Subsequently, the structure shown in FIGS. 40A and 40B is annealed at about 450° C. With this treatment, the metal film 110 reacts with the gate electrode 662, and the gate electrode 662 is made to nickel silicide.

Next, an unreacted metal film 110 is removed using SPM. In this way, gate electrodes 662a and 662b, which are fully silicided, are completed as shown in FIGS. 41A and 41B. Note that the gate electrode 662 may be silicided after an interlayer film is deposited and etched back to expose the surface of the gate electrode 662.

Explanation of subsequent steps is omitted because they are the same as those of the first embodiment.

In the sixth embodiment, the gate electrode 662 is flattened before it is silicided. Accordingly, in the gate electrode 662 after silicidation, the upper gate electrode 662a is made to Ni rich silicide, and the lower gate electrode 662b is made to Si rich silicide. Accordingly, when an unreacted metal layer 110 is removed, the gate electrode 662a may be removed. However, in the sixth embodiment, the polysilicon film 620 acts as a conductor for connecting the portions of gate electrode 662 disposed right and left of the Fin portion 640 to each other. Thus, a problem that the gate electrode 662 is disconnected does not occur. According to the sixth embodiment, the conductor 120 is disposed at a position lower than the upper surface of the gate electrode 62. The semiconductor device according to the sixth embodiment further includes the silicon nitride film 630 as the second insulation film formed on the conductor 120. Since the silicon nitride film 630 protects the conductor 120 from being etched, the portions of the gate electrode 62 disposed on both the sides of the Fin 30 are electrically connected to each other by the low resistance conductor. Accordingly, the semiconductor device can be operated normally without increasing the resistance of the gate electrode.

In the above embodiment, the number of times of the anneal process for forming the silicide is not limited to once. That is, the anneal process may be partly carried out several times. The gate insulation film may be composed of a high dielectric material having a dielectric constant higher than that of the silicon oxide film, an oxide film, an oxinitride film, and the like of the high dielectric material, in addition to the silicon oxide film and hafnium silicate.

In the above embodiment, an SOI substrate is used. However, a bulk silicon substrate may be used.

What is claimed is:

1. A manufacturing method of a semiconductor device, comprising:
    forming a Fin-type body, the Fin-type body being made of a semiconductor material and having an upper surface covered with a protective film;
    forming a gate insulation film on side surfaces of the Fin-type body;
    depositing a gate electrode material on the gate insulation film;
    depositing a covering material different from the gate electrode material so as to cover the Fin-type body and the gate electrode material;
    planarizing the covering material;
    forming a gate electrode and a cover covering the upper surface of the gate electrode by processing the gate electrode material and the covering material;
    forming a gate side wall on side surfaces of the gate electrode and the cover;
    depositing an interlayer insulation film so as to cover the gate electrode and the cover;
    exposing the upper surface of the cover by planarizing the interlayer insulation film;
    forming a trench on the upper surface and side surfaces of the gate electrode by removing the cover;
    depositing a metal layer on the upper surface and the side surfaces of the gate electrode;
    siliciding the gate electrode by reacting the gate electrode with the metal layer;
    removing an unreacted metal in the metal layer; and
    filling the trench with a conductor.

2. The manufacturing method of a semiconductor device according to claim 1, wherein
    the metal layer includes any one of nickel, tungsten, platinum, cobalt, molybdenum, titanium, erbium, ytterbium and palladium.

3. The manufacturing method of a semiconductor device according to claim 1, wherein
    the metal layer is deposited on an exposed surface of the gate electrode.

4. The manufacturing method of a semiconductor device according to claim 3, wherein the conductor is provided on or above the protective film.

5. The manufacturing method of a semiconductor device according to claim 4, wherein
    the depositing a metal layer on the upper surface and the side surfaces of the gate electrode is provided with a portion corresponding to source and drain region that is covered with the insulation film.

6. The manufacturing method of a semiconductor device according to claim 3, wherein
    the depositing a metal layer on the upper surface and the side surfaces of the gate electrode is provided with a portion corresponding to source and drain region that is covered with the insulation film.

7. The manufacturing method of a semiconductor device according to claim 1, wherein
    the conductor is provided on or above the protective film.

8. The manufacturing method of a semiconductor device according to claim 1, wherein
    a first gate electrode provided on a side surface of the Fin-type body via the gate insulation film and a second gate electrode provided on another side surface of the Fin-type body via the gate insulation film are electrically connected with the conductor.

9. The manufacturing method of a semiconductor device according to claim 8, wherein the conductor is provided on or above the protective film.

10. The manufacturing method of a semiconductor device according to claim 1, wherein the depositing a metal layer on the upper surface and the side surfaces of the gate electrode is provided with a portion corresponding to source and drain region that is covered with the insulation film.

\* \* \* \* \*